United States Patent
Adams et al.

(10) Patent No.: US 12,461,457 B2
(45) Date of Patent: Nov. 4, 2025

(54) ASYMMETRY EXTENDED GRID MODEL FOR WAFER ALIGNMENT

(71) Applicant: ASML Netherlands B.V., Veldhoven (NL)

(72) Inventors: Joshua Adams, Wilton, CT (US); Leonardo Gabriel Montilla, Norwalk, CT (US); Nick Franciscus Wilhelmus Thissen, Eindhoven (NL); Leendert Jan Karssemeijer, 's Hertogenbosch (NL); Igor Matheus Petronella Aarts, Port Chester, NY (US); Zahrasadat Dastouri, Norwalk, CT (US)

(73) Assignee: ASML NETHERLANDS B.V., Veldhoven (NL)

( * ) Notice: Subject to any disclaimer, the term of this patent is extended or adjusted under 35 U.S.C. 154(b) by 182 days.

(21) Appl. No.: 18/552,623

(22) PCT Filed: Mar. 21, 2022

(86) PCT No.: PCT/EP2022/057355
§ 371 (c)(1),
(2) Date: Sep. 26, 2023

(87) PCT Pub. No.: WO2022/207395
PCT Pub. Date: Oct. 6, 2022

(65) Prior Publication Data
US 2024/0168397 A1    May 23, 2024

Related U.S. Application Data

(60) Provisional application No. 63/167,538, filed on Mar. 29, 2021.

(51) Int. Cl.
*G03F 7/20*    (2006.01)
*G01B 9/02055*    (2022.01)
(Continued)

(52) U.S. Cl.
CPC ....... *G03F 9/7049* (2013.01); *G01B 9/02062* (2013.01); *G01B 11/161* (2013.01);
(Continued)

(58) Field of Classification Search
CPC ............... G03F 9/7049; G03F 7/70616; G03F 7/706841; G03F 9/7065; G03F 9/7088;
(Continued)

(56) References Cited

U.S. PATENT DOCUMENTS

| | | |
|---|---|---|
| 6,297,876 B1 | 10/2001 | Bornebroek |
| 6,952,253 B2 | 10/2005 | Lof et al. |

(Continued)

FOREIGN PATENT DOCUMENTS

| | | |
|---|---|---|
| EP | 1372040 A2 | 12/2003 |
| TW | 201245905 A | 11/2012 |

(Continued)

OTHER PUBLICATIONS

International Search Report and Written Opinion of the International Searching Authority directed to International Patent Application No. PCT/EP2022/057355, mailed Jul. 26, 2022; 10 pages.

(Continued)

*Primary Examiner* — Mesfin T Asfaw
(74) *Attorney, Agent, or Firm* — Sterne, Kessler, Goldstein & Fox P.L.L.C.

(57) ABSTRACT

Systems, apparatuses, and methods are provided for correcting the detected positions of alignment marks disposed on a substrate and aligning the substrate using the corrected data to ensure accurate exposure of one or more patterns on the substrate. An example method can include receiving measurement data indicative of an interference between light diffracted from a plurality of alignment marks disposed on a substrate or reflected from the substrate. The example method can further include determining substrate deforma- (Continued)

tion data based on the measurement data. The example method can further include determining alignment mark deformation data based on the measurement data. The alignment mark deformation data can include alignment mark deformation spectral pattern data, alignment mark deformation amplitude data, and alignment mark deformation offset data. Subsequently, the example method can include determining a correction to the measurement data based on the substrate deformation data and the alignment mark deformation data.

20 Claims, 10 Drawing Sheets

(51) Int. Cl.
*G01B 11/16* (2006.01)
*G01B 11/27* (2006.01)
*G03F 7/00* (2006.01)
*G03F 9/00* (2006.01)

(52) U.S. Cl.
CPC ........ *G01B 11/272* (2013.01); *G03F 7/70616* (2013.01); *G03F 7/706841* (2023.05); *G03F 9/7065* (2013.01); *G03F 9/7088* (2013.01); *G03F 9/7092* (2013.01)

(58) Field of Classification Search
CPC ............... G03F 9/7092; G03F 7/70625; G01B 9/02062; G01B 11/161; G01B 11/272
See application file for complete search history.

(56) References Cited

U.S. PATENT DOCUMENTS

| | | | |
|---|---|---|---|
| 6,961,116 B2 | 11/2005 | Den Boef et al. | |
| 7,511,799 B2 | 3/2009 | Tel et al. | |
| 8,610,898 B2 | 12/2013 | Khuat Duy | |
| 2010/0125432 A1* | 5/2010 | Sasaki | G03F 9/7026 702/150 |
| 2012/0123581 A1 | 5/2012 | Smilde et al. | |
| 2013/0141723 A1 | 6/2013 | Wei et al. | |
| 2018/0348654 A1* | 12/2018 | Bijnen | G03F 7/70633 |

FOREIGN PATENT DOCUMENTS

| | | | |
|---|---|---|---|
| WO | WO 2020/043582 A1 | 3/2020 | |
| WO | WO 2020/114829 A1 | 6/2020 | |

OTHER PUBLICATIONS

International Preliminary Report on Patentability directed to International Patent Application No. PCT/EP2022/057355, issued Oct. 3, 2023; 7 pages.

* cited by examiner

ASYMMETRY EXTENDED GRID MODEL FOR WAFER ALIGNMENT

CROSS-REFERENCE TO RELATED APPLICATIONS

This application claims priority of U.S. Provisional Patent Application No. 63/167,538, which was filed on Mar. 29, 2021, and which is incorporated herein in its entirety by reference.

TECHNICAL FIELD

The present disclosure relates to metrology systems that may be used, for example, in a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is interchangeably referred to as a mask or a reticle, can be used to generate a circuit pattern to be formed on an individual layer of the IC being formed. This pattern can be transferred onto a target portion (e.g., including part of, one, or several dies) on a substrate (e.g., a silicon wafer). Transfer of the pattern is typically via imaging onto a layer of radiation-sensitive material (e.g., resist) provided on the substrate. In general, a single substrate will contain a network of adjacent target portions that are successively patterned. Traditional lithographic apparatuses include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel (e.g., opposite) to this scanning direction. It is also possible to transfer the pattern from the patterning device to the substrate by imprinting the pattern onto the substrate.

As semiconductor manufacturing processes continue to advance, the dimensions of circuit elements have continually been reduced while the amount of functional elements, such as transistors, per device has been steadily increasing over decades, following a trend commonly referred to as Moore's law. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm.

Extreme ultraviolet (EUV) radiation, for example, electromagnetic radiation having wavelengths of around 50 nanometers (nm) or less (also sometimes referred to as soft x-rays), and including light at a wavelength of about 13.5 nm, can be used in or with a lithographic apparatus to produce extremely small features in or on substrates, for example, silicon wafers. A lithographic apparatus which uses EUV radiation having a wavelength within a range of 4 nm to 20 nm, for example 6.7 nm or 13.5 nm, can be used to form smaller features on a substrate than a lithographic apparatus which uses, for example, radiation with a wavelength of 193 nm.

Methods to produce EUV light include, but are not necessarily limited to, converting a material that has an element, for example, xenon (Xe), lithium (Li), or tin (Sn), with an emission line in the EUV range to a plasma state. For example, in one such method called laser produced plasma (LPP), the plasma can be produced by irradiating a target material, which is interchangeably referred to as fuel in the context of LPP sources, for example, in the form of a droplet, plate, tape, stream, or cluster of material, with an amplified light beam that can be referred to as a drive laser. For this process, the plasma is typically produced in a sealed vessel, for example, a vacuum chamber, and monitored using various types of metrology equipment.

During lithographic operation, different processing steps may require different layers to be sequentially formed on the substrate. Accordingly, it may be necessary to position the substrate relative to prior patterns formed thereon with a high degree of accuracy. Generally, alignment marks are placed on the substrate to be aligned and are located with reference to a second object. A lithographic apparatus may use a metrology system for detecting positions (e.g., X and Y positions) of the alignment marks and for aligning the substrate using the alignment marks to ensure accurate exposure from a mask. The metrology system may be used to determine a height of a wafer surface in the Z direction. However, any asymmetry present in the alignment marks can make it challenging to accurately align the substrate. Further, conventional alignment techniques are typically not capable of removing unwanted effects due to alignment mark asymmetry.

SUMMARY

The present disclosure describes various aspects of systems, apparatuses, and methods for correcting the detected positions of alignment marks disposed on a substrate and for aligning the substrate using the corrected data to ensure accurate exposure of one or more patterns on the substrate.

In some aspects, the present disclosure describes a metrology system. The metrology system can include an illumination system configured to generate light. The metrology system can further include a reflector configured to direct the light towards a substrate. The metrology system can further include an interferometer configured to receive light diffracted from a plurality of alignment marks disposed on the substrate or reflected from the substrate. The interferometer can be further configured to generate output light from an interference between the received light (e.g., the diffracted or reflected light). The metrology system can further include a detector configured to receive the output light from the interferometer. The detector can be further configured to generate a measurement data signal based on the received output light. The metrology system can further include a controller configured to determine substrate deformation data based on the measurement data signal. The controller can be further configured to determine alignment mark deformation data based on the measurement data signal. The alignment mark deformation data can include alignment mark deformation spectral pattern data, alignment mark deformation amplitude data, and alignment mark deformation offset data. The controller can be further configured to determine a correction to the measurement data signal based on the substrate deformation data and the alignment mark deformation data.

In some aspects, the light generated by the illumination system can include a plurality of wavelengths. In some aspects, the light generated by the illumination system can include a plurality of polarization phases.

In some aspects, the controller can be configured to determine the alignment mark deformation data based on a similarity value of spectral and polarization patterns of the measurement data signal to a set of reduced-dimensionality basis functions representing different modes of mark asymmetry. In some aspects, the alignment mark deformation amplitude data can be proportional to an alignment mark asymmetry map (e.g., a wavelength-independent, two-dimensional map) that includes a respective amplitude of each reduced-dimensionality basis function in the set of reduced-dimensionality basis functions.

In some aspects, the controller can be further configured to determine a reference wavelength and determine the alignment mark deformation offset data further based on the reference wavelength. In some aspects, the reference wavelength can correspond to an average wavelength.

In some aspects, the controller can be further configured to modify the alignment mark deformation data using an asymmetry extended grid model (AEGM) machine learning model trained on a set of training wafers by a process that includes, among other operations: (i) fitting alignment mark deformation data on each training wafer in the set of training wafers; and (ii) refitting the fitted alignment mark deformation data for each alignment mark disposed on each wafer in the set of training wafers to generate modified alignment mark deformation data. In some aspects, the controller can be further configured to determine the correction to the measurement data signal based on the substrate deformation data and the modified alignment mark deformation data.

In some aspects, the present disclosure describes a lithographic apparatus. The lithographic apparatus can include an illumination system configured to illuminate a pattern of a patterning device. The lithographic apparatus can further include a projection system configured to project an image of the pattern onto a target portion of a substrate. The lithographic apparatus can further include a metrology system. The metrology system can include an illumination subsystem configured to generate light and a reflector configured to direct the light towards the substrate. The metrology system can further include an interferometer configured to receive light diffracted from a plurality of alignment marks disposed on the substrate or reflected from the substrate. The interferometer can be further configured to generate output light from an interference between the received light (e.g., the diffracted or reflected light). The metrology system can further include a detector configured to receive the output light from the interferometer and generate a measurement data signal based on the received output light. The metrology system can further include a controller configured to determine substrate deformation data based on the measurement data signal. The controller can be further configured to determine alignment mark deformation data based on the measurement data signal. The alignment mark deformation data can include alignment mark deformation spectral pattern data, alignment mark deformation amplitude data, and alignment mark deformation offset data. The controller can be further configured to determine a correction to the measurement data signal based on the substrate deformation data and the alignment mark deformation data.

In some aspects, the light generated by the illumination subsystem can include a plurality of wavelengths. In some aspects, the light generated by the illumination subsystem can include a plurality of polarization phases.

In some aspects, the controller can be configured to determine the alignment mark deformation data based on a similarity value of spectral and polarization patterns of the measurement data signal to a set of reduced-dimensionality basis functions representing different modes of mark asymmetry. In some aspects, the alignment mark deformation amplitude data can be proportional to an alignment mark asymmetry map (e.g., a wavelength-independent, two-dimensional map) that includes a respective amplitude of each reduced-dimensionality basis function in the set of reduced-dimensionality basis functions.

In some aspects, the controller can be further configured to determine a reference wavelength and determine the alignment mark deformation offset data further based on the reference wavelength. In some aspects, the reference wavelength can correspond to an average wavelength.

In some aspects, the controller can be further configured to modify the alignment mark deformation data using an AEGM machine learning model trained on a set of training wafers by a process that includes, among other operations: (i) fitting alignment mark deformation data on each training wafer in the set of training wafers; and (ii) refitting the fitted alignment mark deformation data for each alignment mark disposed on each wafer in the set of training wafers to generate modified alignment mark deformation data. In some aspects, the controller can be further configured to determine the correction to the measurement data signal based on the substrate deformation data and the modified alignment mark deformation data.

In some aspects, the present disclosure describes a method for correcting the detected positions of alignment marks disposed on a substrate. The method can include receiving measurement data indicative of an interference between light diffracted from a plurality of alignment marks disposed on a substrate or reflected from the substrate. The method can further include determining substrate deformation data based on the measurement data. The method can further include determining alignment mark deformation data based on the measurement data. The alignment mark deformation data can include, for example, alignment mark deformation spectral pattern data, alignment mark deformation amplitude data, and alignment mark deformation offset data. The method can further include determining a correction to the measurement data based on the substrate deformation data and the alignment mark deformation data.

In some aspects, the received light can include a plurality of wavelengths. In some aspects, the received light can include a plurality of polarization phases.

In some aspects, the determining the alignment mark deformation data can be based on a similarity value of spectral and polarization patterns of the measurement data to a set of reduced-dimensionality basis functions representing different modes of mark asymmetry. In some aspects, the alignment mark deformation amplitude data can be proportional to an alignment mark asymmetry map (e.g., a wavelength-independent, two-dimensional map) that includes a respective amplitude of each reduced-dimensionality basis function in the set of reduced-dimensionality basis functions.

In some aspects, the method can further include determining a reference wavelength and determining the alignment mark deformation offset data further based on the reference wavelength. In some aspects, the reference wavelength can correspond to an average wavelength.

In some aspects, the method can further include modifying the alignment mark deformation data using an AEGM machine learning model trained on a set of training wafers by a process that includes, among other operations: (i) fitting alignment mark deformation data on each training wafer in the set of training wafers; and (ii) refitting the fitted alignment mark deformation data for each alignment mark disposed on each wafer in the set of training wafers to generate modified alignment mark deformation data. In some aspects, the method can further include determining the correction to the measurement data signal based on the substrate deformation data and the modified alignment mark deformation data.

Further features, as well as the structure and operation of various aspects, are described in detail below with reference to the accompanying drawings. It is noted that the disclosure is not limited to the specific aspects described herein. Such aspects are presented herein for illustrative purposes only.

Additional aspects will be apparent to persons skilled in the relevant art(s) based on the teachings contained herein.

BRIEF DESCRIPTION OF THE DRAWINGS

The accompanying drawings, which are incorporated herein and form part of the specification, illustrate the present disclosure and, together with the description, further serve to explain the principles of the aspects of this disclosure and to enable a person skilled in the relevant art(s) to make and use the aspects of this disclosure.

Figure 1A:
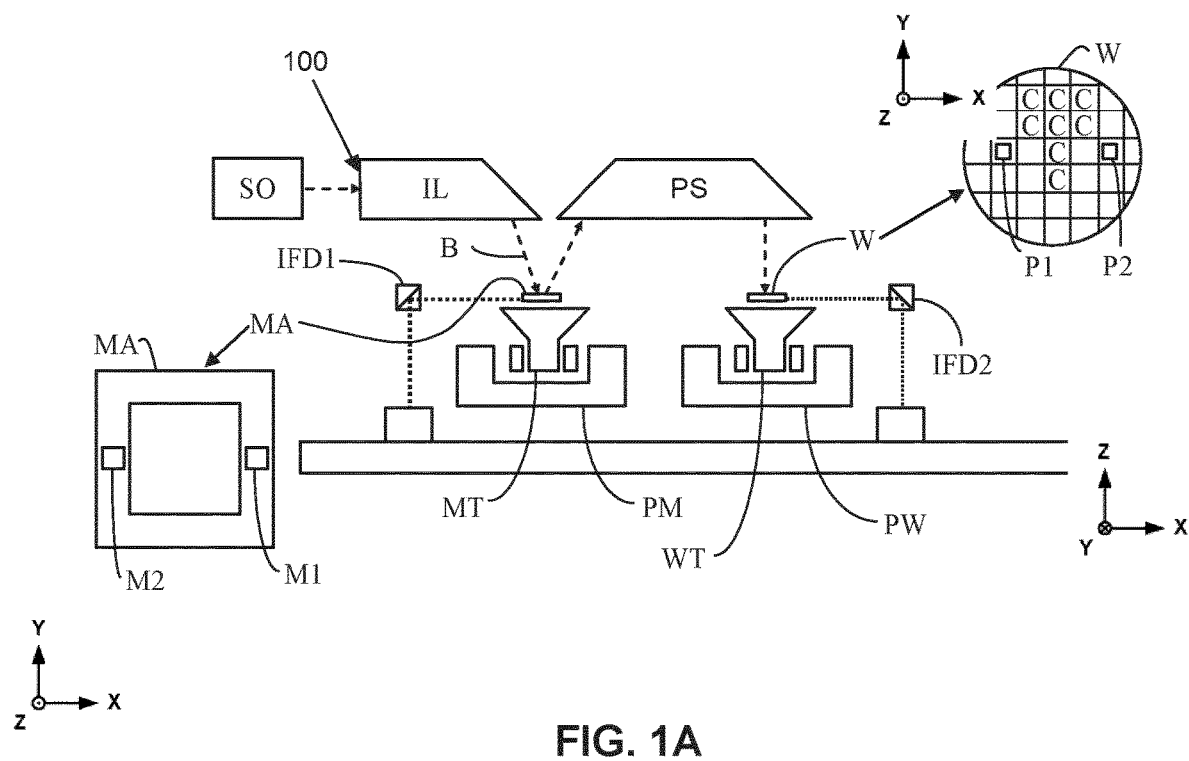
FIG. 1A is a schematic illustration of an example reflective lithographic apparatus according to some aspects of the present disclosure.

The features and advantages of the present disclosure will become more apparent from the detailed description set forth below when taken in conjunction with the drawings, in which like reference characters identify corresponding elements throughout. In the drawings, unless otherwise indicated, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of the present disclosure. The disclosed embodiment(s) merely describe the present disclosure. The scope of the disclosure is not limited to the disclosed embodiment(s). The breadth and scope of the disclosure are defined by the claims appended hereto and their equivalents.

The embodiment(s) described, and references in the specification to "one embodiment," "an embodiment," "an example embodiment," etc., indicate that the embodiment(s) described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Overview

In one example, ICs are built up layer by layer and can have 30 or more layers. On Product Overlay (OPO) is a measure of a lithographic apparatus's ability to fabricate these layers accurately on top of each other. Successive layers or multiple processes on the same layer must be accurately aligned to the previous layer. Otherwise, electrical contact between structures can be poor and the resulting devices may not perform to specification. Accurate alignment (e.g., decreased OPO error) can increase device yield and enable smaller product patterns to be fabricated.

Process-induced wafer errors arising from the complexity of the patterns as well as the quantity of patterned layers can be a main contributor to (OPO) errors. For example, wafer alignment errors resulting from horizontal (e.g., x, y, Rz) alignment of wafers before they are exposed can be a predominate source of OPO error and, in some instances, contribute to roughly half of the OPO errors for a particular technology node. These OPO errors can have relatively high spatial variations from wafer to wafer as well as within each wafer.

Process-induced wafer errors can be mitigated by measuring the relative position of several alignment marks within a field to reduce OPO errors. Alignment error variations within the field can be used in a regression model to correct OPO errors within the field. Process-induced wafer errors can be further mitigated by measuring the relative positions of several alignment marks within a particular measurement field. For example, alignment error variation within the field can be used to fit a model to correct for OPO within the field. The OPO error between successive layers formed in or on the patterned substrate can be controlled by various parts of the exposure system of the lithographic apparatus as described in greater detail below.

In order to control a lithographic process to place device features accurately on the substrate, one or more diffraction targets (e.g., alignment marks) can be provided on the substrate, and the lithographic apparatus can include one or more alignment sensors (e.g., forming a position measuring apparatus) configured to measure the positions of the one or more diffraction targets. Additionally, a fringe pattern can be formed by two off-axis coherent beams of an alignment sensor to provide structured illumination, which can act as a projected reference grating to investigate diffraction target asymmetry and substantially eliminate the need for a separate physical reference grating.

A lithographic apparatus can include one or more alignment systems configured to measure the position of the diffraction target and align the substrate with respect to the lithographic apparatus. For example, the data can be obtained using a SMart Alignment Sensor Hybrid (SMASH) sensor that employs a self-referencing interferometer with a single detector and four different wavelengths, and extracts the alignment signal in software. An example SMASH sensor is described in, for example, U.S. Pat. No. 6,961,116, issued Nov. 1, 2005, and titled "Lithographic Apparatus, Device Manufacturing Method, and Device Manufactured Thereby," which is hereby incorporated by reference in its entirety. In another example, the data can be obtained using an Advanced Technology using High order ENhancement of Alignment (ATHENA) sensor that directs each of seven diffraction orders to a dedicated detector. An example ATHENA sensor is described in, for example, U.S. Pat. No. 6,297,876, issued Oct. 2, 2001, and titled "Lithographic Projection Apparatus with an Alignment System for Aligning Substrate on Mask," which is hereby incorporated by reference in its entirety.

In yet another example, an alignment system can include a self-referencing interferometer configured to produce two overlapping images of an alignment mark, rotate these two overlapping images over 180 degrees with respect to each other, and detect the intensity variation of the interfering Fourier transforms of these two overlapping images in a pupil plane. These intensity variations can correspond to a phase difference between different diffraction orders of the two overlapping images. The self-referencing interferometer can derive phase difference positional information from this phase difference for use in the alignment process. Example alignment systems that include self-referencing interferometers are described in, for example, European Patent No. EP 1 372 040, granted Mar. 5, 2008, and titled "Lithographic Apparatus and Device Manufacturing Method," and U.S. Pat. No. 8,610,898, issued Dec. 17, 2013, and titled "Self-Referencing Interferometer, Alignment System, and Lithographic Apparatus," each of which is hereby incorporated by reference in its entirety.

Additionally, measurement of a plurality of alignment marks can enable modeling and correction of intra-field distortion. For example, parallel-wafer alignment systems can be implemented to enable correction of intra-field distortion without substantially impacting overall throughput. These parallel-wafer alignment system can utilize interferometry and multi-mode interference (MMI) to measure the position of the diffraction target and align the substrate with respect to the lithographic apparatus. Example parallel-wafer alignment systems are described in, for example, U.S. Provisional Patent Application No. 62/724,198, filed Aug. 29, 2018, and titled "Compact Alignment Sensor Arrangements," and U.S. Provisional Patent Application No. 62/877,964, filed Jul. 24, 2019, and titled "On Chip Wafer Alignment Sensor," each of which is hereby incorporated by reference in its entirety.

However, these and other alignment systems and techniques can be subject to certain drawbacks and limitations. For example, alignment marks can suffer from asymmetry that can appear as false wafer deformation data causing the lithographic apparatus to print a new layer at the wrong position and cause OPO error. There are many types of alignment mark asymmetry, such as side wall angle, floor tilt, top tilt, critical dimension (CD) imbalance, and the like. The effect of alignment mark asymmetry is also a function of the alignment mark design (e.g., pitch, subsegmentation) and the stack of layers placed above and below and alignment mark. But in general all these situations create a wavelength ($\lambda$) and polarization dependent signal while a symmetric mark will return the same phase determined position for all color (e.g., wavelength) and polarization signals.

In some aspects, alignment mark asymmetry can negatively influence alignment signals. For instance, the asymmetric alignment mark can be observable from the wavelength dependence (also referred to as a "swing curve"). In another example, the average color or all colors can systematically diverge from their correct location in a way that is not directly observable with alignment-only data but that is still critical for overlay. In another example, alignment mark asymmetry can manifest in wafer alignment measurements in a substantially clockwise manner (e.g., in an alignment color-to-color measurement on a back-end-of-line wafer characteristic of chemical-mechanical polishing, other process steps, or a combination thereof). In addition, exposure recipes often use a single color, and that color may either be known or determined (e.g., by selecting a color and determining if it is actually correct). In yet another example, the diffraction grating targets, which are intended to be printed symmetrically, can be deformed during processing in ways that can change an alignment mark's apparent position. When an alignment mark becomes asymmetric, the asymmetric alignment mark can begin to change the measured position for different measurement colors and polarizations.

Accordingly, there is a need for a metrology system that can consider multiple color and polarization channels to make a predicted wafer deformation map to calibrate out the alignment mark asymmetries.

In contrast, some aspects of the present disclosure can provide systems, apparatuses, methods, and computer program products for using multi-color and polarization alignment sensor signals (e.g., 12 colors and 2 polarizations) to calibrate out the effects of alignment mark asymmetries and, in some aspects, generate in-situ exposure recipes and process monitoring to correct for these alignment mark asymmetries. In some aspects, the present disclosure can derive the multi-color and polarization alignment positions from alignment mark phase difference measurements. In some aspects, the present disclosure provides for performing these and other operations independent of overlay measurements.

In some aspects, the present disclosure provides an alignment mark asymmetry corrected model based on one or more of the following non-exhaustive assumptions:

1. Alignment mark asymmetries can create effects that can be detected by non-constant phase swing curves. The term "phase swing curve" refers to a measured phase difference (e.g., align position difference (APD)) as a function of color and polarization.

2. The phase swing curve signature can have a linear relationship with the magnitude of any one alignment mark asymmetry, and this relationship can hold individually for each color or polarization channel.

3. Multiple alignment mark asymmetry modes can exist and create detectably different phase swing curves having different distributions across the wafer.

4. The alignment mark asymmetry data and the mechanical wafer deformation can have some common shapes (e.g., less than 100 percent) across the wafer.

5. The "correct" position for alignment can be where the alignment mark would appear if no alignment mark asymmetry were present. The "correct" position can be determined by, among other aspects, measuring with independent means (e.g., overlay or scanning electron microscope (SEM) imaging) or using an average or reference color after all the "swing curve" effects have been removed by the prior method.

In some aspects, the present disclosure provides an asymmetry extended grid model (AEGM) machine learning model for substrate alignment (referred to herein as an "AEGM technique"). The AEGM technique disclosed herein can provide for generating relative alignment mark asymmetry maps using the information in color-to-color (and, in some aspects, polarization) measurements. In some aspects, the AEGM technique disclosed herein can be formalized by performing principal component analysis (PCA), a statistical method that identifies a small number of basis functions to describe the full variance in a datasets. Example techniques for principle components analysis are described in, for example, U.S. Provisional Patent Application No. 62/775,780, filed Dec. 5, 2018, and titled "Adaptive Alignment," which is hereby incorporated by reference in its entirety).

In some aspects, the present disclosure provides for both reducing the degrees of freedom and also permitting flexibility to find a handful of dominant asymmetry modes (e.g., in some aspects between 1 and 3 dominant asymmetry modes) in real data. In some aspects, the average color may be used as a convenient reference going forward. This average color may have its own sensitivity to alignment mark asymmetry which can be difficult to directly observe, but on a mark-by-mark relative basis, the error for the average color can be linearly proportional to the color-to-color difference. Combining these features, the alignment mark deformation maps in the first step can make a good spatial basis function, modulo an unknown scaling factor, to describe the align position deviation (APD) for the average color.

In some aspects, the normal wafer deformation grid (e.g., 6 par per wafer (6par) or High Order Wafer Alignment (HOWA)) can be fit substantially simultaneously with a scaling factor on the new alignment mark deformation basis function to provide a more correct and complete result. For instance, there may be commonly between 30 and 80 alignment mark measurements made per wafer, commonly between 6 and 30 grid terms already fit to wafers (e.g., 6par, HOWA). In some aspects, the present disclosure can add 2*N more fit terms where N represents the number of asymmetry models (e.g., N=1, N=2, N=3) and the factor two represents different properties in each of the X and Y directions (e.g., alignment marks in different directions can have different designs and different mark asymmetry responses).

In some aspects, a swing curve function $c_i(\lambda)$ can represent the sensitivity of APD to mark asymmetry as a function of color relative to the average color, and a mark deformation parameter $s_{avg,i}$ can be associated with the swing curve function $c_i(\lambda)$. The index i is an integer value between 1 and N that indicates there may be several asymmetry modes with their own behavior. The alignment mark deformation map $MD_i(x,y)$ is the score or magnitude of the swing curve $c_i(\lambda)$ on a mark-by-mark basis, which in some aspects can be determined using PCA. The subscript "WD" refers to wafer deformation, and the subscript "MD" refers to alignment mark deformation. In some aspects, a decomposition of wafer deformation, alignment mark asymmetry, and wavelength dependence can be represented as shown in Equation 1:

$$APD(\lambda, x, y) = APD_{WD}(x, y) + APD_{MD}(\lambda, x, y) = \tag{1}$$
$$APD_{WD}(x, y) + \left\{ \sum_{i=1}^{N} [s_{avg,i} + c_i(\lambda)] \cdot MD_i(x, y) \right\}$$

In some aspects, when alignment marks have different designs (e.g., different pitches, different subsegmengations) in the x and y directions, separate mark asymmetry swing curves can be made for each alignment mark. In some aspects, once $c_i(\lambda)$ and $MD_i(x, y)$ have been determined, Equation 1 can be solved using a linear least squares technique by, among other features, fitting the APD of the average color since by definition it can cause the term $c_i(\lambda)$ to be zero. It is to be understood that any reference wavelength can be utilized, but using the average color can be desired as it allows a separation of variables between $\lambda$ and position (x,y). In some aspects, some functional form can be selected for the wafer deformation.

In one illustrative and nonlimiting example, an example of combined grid and mark asymmetry fit can utilize common 6par parameters (although higher orders are also possible) as shown in Equation 2:

$$\begin{bmatrix} \overline{x_{nom} + APD_{avg,x}} \\ \overline{y_{nom} + APD_{avg,y}} \end{bmatrix} = \tag{2}$$

$$\begin{bmatrix} 1 & 0 & \overline{x_{nom}} & 0 & \overline{y_{nom}} & 0 & MD_{x,1}(\overline{x_{nom}}, \overline{y_{nom}}) & 0 \\ 0 & 1 & 0 & \overline{y_{nom}} & 0 & \overline{x_{nom}} & 0 & MD_{y,1}(\overline{x_{nom}}, \overline{y_{nom}}) \end{bmatrix}$$

$$\begin{matrix} \dots & MD_{x,n}(\overline{x_{nom}}, \overline{y_{nom}}) & 0 \\ \dots & 0 & MD_{y,n}(\overline{x_{nom}}, \overline{y_{nom}}) \end{matrix} \begin{bmatrix} T_x \\ T_y \\ M_{wx} \\ M_{wy} \\ -(R+N_0) \\ R \\ s_{avg,x,1} \\ s_{avg,y,1} \\ \vdots \\ s_{avg,x,n} \\ s_{avg,y,n} \end{bmatrix}$$

The straight lines above particular terms in Equation 2 represent vectors (e.g., over all alignment mark positions). As there can be between 26 and 80 or more alignment mark position vectors per wafer, there are substantially more observables than degrees of freedom. The subscript "nom" means nominal, or expected, position for the alignment mark. The subscript "avg" represents average wavelength and polarization. The terms $T_x$ and $T_y$ represent wafer translation resulting from loading errors. The terms $M_{wx}$ and $M_{wy}$ represent wafer scaling factors (e.g., magnification). The terms $-(R+NO)$ and R represent wafer rotation terms. The $s_{avg}$ terms represent average offset and, in some aspects, can include $s_{avg,x,1}$, $s_{avg,x,2}$, $s_{avg,x,3}$, $s_{avg,y,1}$, $s_{avg,y,2}$, $s_{avg,y,3}$, or a subset thereof.

Directly implementing these equations can effectively fit each wafer individually for a particular mix of mark asymmetry, which can be desirable when very few wafers may be available. However, in some aspects, separating the spatial shape of alignment mark deformation (MD per mark location) from wafer deformation can be difficult when performing this "per-wafer" technique. For example, when the mark deformation shape is a low-order magnification, the solution to Equation 2 may attribute that to either the wafer deformation parameter $M_w$ or the alignment mark deformation parameter $s_{avg}$.

In some aspects, the present disclosure can overcome this potential degeneracy to separate the wafer deformation part of the measured alignment signal from the alignment mark deformation part of the measured alignment signal (e.g., to remove the contribution of alignment mark deformation from the measured alignment signal) by utilizing one or more of the non-exhaustive following techniques:

1. Utilize an AEGM machine learning model to train the AEGM technique on a set of multiple training wafers. In such aspects, the wafer deformation parameters can be allowed to vary separately per wafer, while the mark deformation parameter $s_{avg}$ can be kept constant and fit simultaneously on all training wafers. After the swing curve terms $s_{avg}$ and $c(\lambda)$ are fit or trained on a set of wafers, they can be held fixed. Then, the mark deformation terms MD can be refit on a mark-by-mark basis while normalizations to the color-to-average are performed on later wafers. In some aspects, this technique can permit the amplitude and asymmetry mix to flexibly change from wafer-to-wafer, but will give a realistic constraint as the type of alignment mark asymmetry can be substantially fixed by the process. This technique can particularly desirable in stable, high volume operation.

2. Apply the AEGM technique to multiple alignment mark types at substantially the same time, each with its own sensitivity to alignment mark deformation. Effectively, each alignment mark type can find the same wafer deformation parameters but fit a different mark deformation parameter $s_{avg}$. In some aspects, sets of alignment marks can be placed close together to avoid measuring different wafer deformation for each alignment mark type (e.g., due to intrafield content).

3. Utilize a machine learning technique to train the AEGM technique on a single wafer but with multiple wafer loads. In some aspects, wafer deformation parameters can vary slightly per wafer load (e.g., mostly translation and rotation), while mark deformation may not substantially change. As a result, the degeneracy between the two may be solved.

4. Use stack simulation techniques to verify the output of the AEGM technique or compute the $s_{avg}$ and swing curve $c(\lambda)$ terms. For example, the phase swing curves, once fit, can be associated with stack simulations. Subsequently, rigorous coupled wave analysis (RCWA) models can directly predict the average color phase offset $s_{avg}$ rather than fitting together with the wafer grid.

5. Use regularization techniques such that measurements can preferentially accrue to one of the wafer or mark deformation terms unless the fitting statistics are clear enough to overcome the chosen regularization term.

6. Perform the final fit for the $s_{avg,i}$ term with independent data (e.g., in some cases via overlay data). This step can remove substantially all degeneracy between the wafer and mark deformation present in alignment-only data. This step can also be performed as an in-line verification while overlay data is gathered to verify that the appropriate alignment parameters were selected prior to lithography exposure.

In some aspects, the AEGM technique described above can be summarized as follows. The first step can be to find the right parameterization (e.g., recognize that wafer deformation has substantially no wavelength dependence, separate the amplitude of the mark deformation from its spectral shape or swing curve, and include a color-independent offset for the average or reference color) as shown above in Equation 1. The second step can be to use the color-to-average values to solve for the swing curves $c_i(\lambda)$ and the alignment mark deformation amplitudes $MD_i(x,y)$ utilizing the data-science method of Principal Components Analysis. The third step can be to solve for the average offset $s_{avg,i}$. Although there may not be enough information to solve for $s_{avg,i}$ at a per-mark level, $s_{avg,i}$ can be solved with a wafer grid fit since (i) the mark deformation can vary in amplitude over the wafer and (ii) the alignment position error can be proportional to the product of $c_i(\lambda)$ and $MD_i(x,y)$. In some aspects, the final step can be to solve for the wafer deformation $APD_{WD}(x,y)$. In some aspects, there can be enough difference between wafer deformation and alignment mark deformation to provide a good fit. One illustrative example of a substantially simultaneous grid and mark deformation fit for a 6par model is shown above in Equation 2.

There are many exemplary aspects to the systems, apparatuses, methods, and computer program products disclosed herein. For example, aspects of the present disclosure can provide for a minimal set of physical assumptions to translate alignment mark asymmetry into multi-color and multi-polarization wafer alignment measurements and vice versa. In another example, aspects of the present disclosure can generate alignment recipes from alignment-only data. In another example, aspects of the present disclosure can separate variables (e.g., $\lambda$ and position) to reduce the number of unnecessary degrees of freedom and thereby reduce the time and computing costs (e.g., central processing unit (CPU), memory, etc.) required to correct measured alignment mark positions. In another example, aspects of the present disclosure can provide a methodology to fit a mix of mark asymmetries. In another example, aspects of the present disclosure can provide methodologies either (i) to fit the model on a per-wafer basis or (ii) to train the model using a machine learning technique, keeping key parameters floating depending on end-user context. In another example, aspects of the present disclosure can provide specific and useful process monitoring key performance indicators (KPIs) to track end-user process stability.

In another example, aspects of the present disclosure can provide increased process window control by providing more accurate OPO. In one illustrative and non-limiting example, when an alignment color-to-color measurement on a back-end-of-line wafer is about 4 to 6 nm, even an overlay selected single best color can have 1 to 2 nm of wafer-towafer and lot-to-lot error. Further, an average OPO penalty in an example consolidated OPO budget can be about 0.5 nm. Aspects of the present disclosure can calibrate a significant (e.g., about 50 percent) portion of this remaining alignment mark asymmetry impact. Additionally, aspects of the present disclosure can further provide increased process window control by providing better flexibility to a changing mix of alignment mark asymmetry at end-user facilities. As a result, there is less need to retrain alignment recipes and better lot-to-lot control for effects such as etcher-coater-scanner machine-to-machine mix and matching.

In another example, aspects of the present disclosure can provide for process window detection by detecting when an asymmetry mode or magnitude has drifted beyond a static or dynamic threshold value. Subsequently, aspects of the present disclosure can generate actionable guidance (e.g., electronic documentation with or without user input fields) and transmit that guidance to a user device to prompt an end-user to check other equipment.

In another example, aspects of the present disclosure can provide process window enhancement by providing for alignment mark design freedom. For instance, more alignment mark types can be input into an OPO process window to help end-users gain freedom for layout and density design rules. Aspects of the present disclosure can further provide for alignment-only recipe determination that does not need overlay measurements (e.g., saves cost, time-to-recipe) and utilizes a smaller training set to start an alignment recipe (e.g., a few wafers rather than tens of wafer lots).

In another example, aspects of the present disclosure can provide for positioning alignment marks closer to the edge of the wafer. For instance, aspects of the present disclosure can calibrate out more alignment mark asymmetry to permit measuring closer to wafer edge, capturing real edge roll-off effects, and producing more dies within specified tolerances (e.g., increasing yield). As a result, wafer grid error can be decreased substantially (e.g., below an example consolidated OPO budget of 1.1 nm for wafer grid error).

Before describing such aspects in more detail, however, it is instructive to present an example environment in which aspects of the present disclosure can be implemented.

Example Lithographic Systems

Figure 1B:
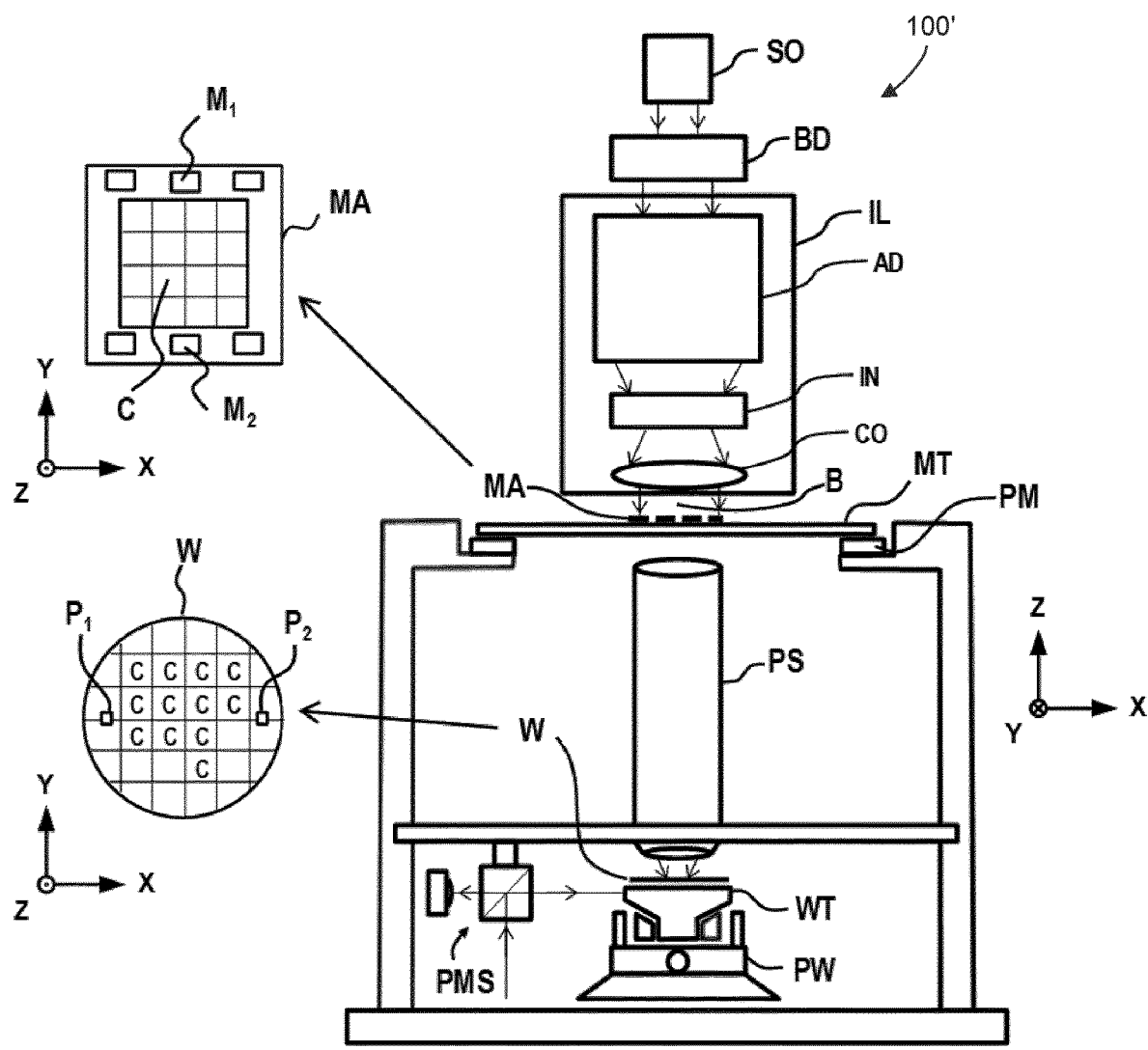
FIG. 1B is a schematic illustration of an example transmissive lithographic apparatus according to some aspects of the present disclosure.

FIGS. 1A and 1B are schematic illustrations of a lithographic apparatus 100 and a lithographic apparatus 100', respectively, in which aspects of the present disclosure can be implemented. As shown in FIGS. 1A and 1B, the lithographic apparatuses 100 and 100' are illustrated from a point of view (e.g., a side view) that is normal to the XZ plane (e.g., the X-axis points to the right, the Z-axis points upward, and the Y-axis points into the page away from the viewer), while the patterning device MA and the substrate W are presented from additional points of view (e.g., a top view) that are normal to the XY plane (e.g., the X-axis points to the right, the Y-axis points upward, and the Z-axis points out of the page toward the viewer).

In some aspects, the lithographic apparatus 100 and/or the lithographic apparatus 100' can include one or more of the following structures: an illumination system IL (e.g., an illuminator) configured to condition a radiation beam B (e.g., a deep ultra violet (DUV) radiation beam or an extreme ultra violet (EUV) radiation beam); a support structure MT (e.g., a mask table) configured to support a patterning device MA (e.g., a mask, a reticle, or a dynamic patterning device) and connected to a first positioner PM configured to accurately position the patterning device MA; and, a substrate holder such as a substrate table WT (e.g., a wafer table) configured to hold a substrate W (e.g., a resist-coated wafer) and connected to a second positioner PW configured to accurately position the substrate W. Lithographic apparatuses 100 and 100' also have a projection system PS (e.g., a refractive projection lens system) configured to project a pattern imparted to the radiation beam B by patterning device MA onto a target portion C (e.g., a portion including one or more dies) of the substrate W. In lithographic apparatus 100, the patterning device MA and the projection system PS are reflective. In lithographic apparatus 100', the patterning device MA and the projection system PS are transmissive.

In some aspects, in operation, the illumination system IL can receive a radiation beam from a radiation source SO (e.g., via a beam delivery system BD shown in FIG. 1B). The illumination system IL can include various types of optical structures, such as refractive, reflective, catadioptric, magnetic, electromagnetic, electrostatic, and other types of optical components, or any combination thereof, for directing, shaping, or controlling radiation. In some aspects, the illumination system IL can be configured to condition the radiation beam B to have a desired spatial and angular intensity distribution in its cross-section at a plane of the patterning device MA.

In some aspects, the support structure MT can hold the patterning device MA in a manner that depends on the orientation of the patterning device MA with respect to a reference frame, the design of at least one of the lithographic apparatuses 100 and 100', and other conditions, such as whether or not the patterning device MA is held in a vacuum environment. The support structure MT can use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

In some aspects, the patterning device MA can be transmissive (as in lithographic apparatus 100' of FIG. 1B) or reflective (as in lithographic apparatus 100 of FIG. 1A). The patterning device MA can include various structures such as reticles, masks, programmable mirror arrays, programmable LCD panels, other suitable structures, or combinations thereof. Masks can include mask types such as binary, alternating phase shift, or attenuated phase shift, as well as various hybrid mask types. In one example, a programmable mirror array can include a matrix arrangement of small mirrors, each of which can be individually tilted so as to reflect an incoming radiation beam in different directions. The tilted mirrors can impart a pattern in the radiation beam B, which is reflected by a matrix of small mirrors.

The term "projection system" PS should be interpreted broadly and can encompass any type of projection system, including refractive, reflective, catadioptric, magnetic, anamorphic, electromagnetic, and electrostatic optical systems, or any combination thereof, as appropriate for the exposure radiation being used, and/or for other factors such as the use of an immersion liquid (e.g., on the substrate W) or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps. In addition, any use herein of the term "projection lens" can be interpreted, in some aspects, as synonymous with the more general term "projection system" PS.

In some aspects, the lithographic apparatus 100 and/or the lithographic apparatus 100' can be of a type having two (e.g., "dual stage") or more substrate tables WT and/or two or more mask tables). In such "multiple stage" machines, the additional substrate tables WT can be used in parallel, or preparatory steps can be carried out on one or more tables while one or more other substrate tables WT are being used for exposure. In one example, steps in preparation of a subsequent exposure of the substrate W can be carried out on the substrate W located on one of the substrate tables WT while another substrate W located on another of the substrate tables WT is being used for exposing a pattern on another substrate W. In some aspects, the additional table may not be a substrate table WT.

In some aspects, in addition to the substrate table WT, the lithographic apparatus 100 and/or the lithographic apparatus 100' can include a measurement stage. The measurement stage can be arranged to hold a sensor. The sensor can be arranged to measure a property of the projection system PS, a property of the radiation beam B, or both. In some aspects, the measurement stage can hold multiple sensors. In some aspects, the measurement stage can move beneath the projection system PS when the substrate table WT is away from the projection system PS.

In some aspects, the lithographic apparatus 100 and/or the lithographic apparatus 100' can also be of a type wherein at least a portion of the substrate can be covered by a liquid having a relatively high refractive index, e.g., water, so as to fill a space between the projection system PS and the substrate W. An immersion liquid can also be applied to other spaces in the lithographic apparatus, for example, between the patterning device MA and the projection system PS. Immersion techniques provide for increasing the numerical aperture of projection systems. The term "immersion" as used herein does not mean that a structure, such as a substrate, must be submerged in liquid, but rather only means that liquid is located between the projection system and the substrate during exposure. Various immersion techniques are described in U.S. Pat. No. 6,952,253, issued Oct. 4, 2005, and titled "LITHOGRAPHIC APPARATUS AND DEVICE MANUFACTURING METHOD," which is incorporated by reference herein in its entirety.

Referring to FIGS. 1A and 1B, the illumination system IL receives a radiation beam B from a radiation source SO. The radiation source SO and the lithographic apparatus 100 or 100' can be separate physical entities, for example, when the radiation source SO is an excimer laser. In such cases, the radiation source SO is not considered to form part of the lithographic apparatus 100 or 100', and the radiation beam B passes from the radiation source SO to the illumination system IL with the aid of a beam delivery system BD (e.g., shown in FIG. 1B) including, for example, suitable directing mirrors and/or a beam expander. In other cases, the radiation source SO can be an integral part of the lithographic apparatus 100 or 100', for example, when the radiation source SO is a mercury lamp. The radiation source SO and the illuminator IL, together with the beam delivery system BD, if required, can be referred to as a radiation system.

In some aspects, the illumination system IL can include an adjuster AD for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illumination system IL can include various other components, such as an integrator IN and a radiation collector CO (e.g., a condenser or collector optic). In some aspects, the illumination system IL can be used to condition the radiation beam B to have a desired uniformity and intensity distribution in its cross section.

Referring to FIG. 1A, in operation, the radiation beam B can be incident on the patterning device MA (e.g., a mask, reticle, programmable mirror array, programmable LCD panel, any other suitable structure or combination thereof), which can be held on the support structure MT (e.g., a mask table), and can be patterned by the pattern (e.g., design layout) present on the patterning device MA. In lithographic apparatus 100, the radiation beam B can be reflected from the patterning device MA. Having traversed (e.g., after being reflected from) the patterning device MA, the radiation beam B can pass through the projection system PS, which can focus the radiation beam B onto a target portion C of the substrate W or onto a sensor arranged at a stage.

In some aspects, with the aid of the second positioner PW and position sensor IFD2 (e.g., an interferometric device, linear encoder, or capacitive sensor), the substrate table WT can be moved accurately, e.g., so as to position different target portions C in the path of the radiation beam B. Similarly, the first positioner PM and another position sensor IFD1 (e.g., an interferometric device, linear encoder, or capacitive sensor) can be used to accurately position the patterning device MA with respect to the path of the radiation beam B.

In some aspects, patterning device MA and substrate W can be aligned using mask alignment marks M1 and M2 and substrate alignment marks P1 and P2. Although FIGS. 1A and 1B illustrate the substrate alignment marks P1 and P2 as occupying dedicated target portions, the substrate alignment marks P1 and P2 may be located in spaces between target portions. Substrate alignment marks P1 and P2 are referred to as scribe-lane alignment marks when they are located between the target portions C. Substrate alignment marks P1 and P2 can also be arranged in the target portion C area as in-die marks. These in-die marks can also be used as metrology marks, for example, for overlay measurements.

In some aspects, for purposes of illustration and not limitation, one or more of the figures herein can utilize a Cartesian coordinate system. The Cartesian coordinate system includes three axes: an X-axis; a Y-axis; and a Z-axis. Each of the three axes is orthogonal to the other two axes (e.g., the X-axis is orthogonal to the Y-axis and the Z-axis, the Y-axis is orthogonal to the X-axis and the Z-axis, the Z-axis is orthogonal to the X-axis and the Y-axis). A rotation around the X-axis is referred to as an Rx-rotation. A rotation around the Y-axis is referred to as an Ry-rotation. A rotation around about the Z-axis is referred to as an Rz-rotation. In some aspects, the X-axis and the Y-axis define a horizontal plane, whereas the Z-axis is in a vertical direction. In some aspects, the orientation of the Cartesian coordinate system may be different, for example, such that the Z-axis has a component along the horizontal plane. In some aspects, another coordinate system, such as a cylindrical coordinate system, can be used.

Referring to FIG. 1B, the radiation beam B is incident on the patterning device MA, which is held on the support structure MT, and is patterned by the patterning device MA. Having traversed the patterning device MA, the radiation beam B passes through the projection system PS, which focuses the beam onto a target portion C of the substrate W. In some aspects, the projection system PS can have a pupil conjugate to an illumination system pupil. In some aspects, portions of radiation can emanate from the intensity distribution at the illumination system pupil and traverse a mask pattern without being affected by diffraction at the mask pattern MP and create an image of the intensity distribution at the illumination system pupil.

The projection system PS projects an image MP' of the mask pattern MP, where image MP' is formed by diffracted beams produced from the mask pattern MP by radiation from the intensity distribution, onto a resist layer coated on the substrate W. For example, the mask pattern MP can include an array of lines and spaces. A diffraction of radiation at the array and different from zeroth-order diffraction generates diverted diffracted beams with a change of direction in a direction perpendicular to the lines. Reflected light (e.g., zeroth-order diffracted beams) traverses the pattern without any change in propagation direction. The zeroth-order diffracted beams traverse an upper lens or upper lens group of the projection system PS, upstream of the pupil conjugate of the projection system PS, to reach the pupil conjugate. The portion of the intensity distribution in the plane of the pupil conjugate and associated with the zeroth-order diffracted beams is an image of the intensity distribution in the illumination system pupil of the illumination system IL. In some aspects, an aperture device can be disposed at, or substantially at, a plane that includes the pupil conjugate of the projection system PS.

The projection system PS is arranged to capture, by means of a lens or lens group, not only the zeroth-order diffracted beams, but also first-order or first- and higher-order diffracted beams (not shown). In some aspects, dipole illumination for imaging line patterns extending in a direction perpendicular to a line can be used to utilize the resolution enhancement effect of dipole illumination. For example, first-order diffracted beams interfere with corresponding zeroth-order diffracted beams at the level of the substrate W to create an image of the mask pattern MP at highest possible resolution and process window (e.g., usable depth of focus in combination with tolerable exposure dose deviations). In some aspects, astigmatism aberration can be reduced by providing radiation poles (not shown) in opposite quadrants of an illumination system pupil. Further, in some aspects, astigmatism aberration can be reduced by blocking the zeroth-order beams in the pupil conjugate of the projection system PS associated with radiation poles in opposite quadrants. This is described in more detail in U.S. Pat. No. 7,511,799, issued Mar. 31, 2009, and titled "LITHOGRAPHIC PROJECTION APPARATUS AND A DEVICE MANUFACTURING METHOD," which is incorporated by reference herein in its entirety.

In some aspects, with the aid of the second positioner PW and a position measurement system PMS (e.g., including a position sensor such as an interferometric device, linear encoder, or capacitive sensor), the substrate table WT can be moved accurately, e.g., so as to position different target portions C in the path of the radiation beam B at a focused and aligned position. Similarly, the first positioner PM and another position sensor (e.g., an interferometric device, linear encoder, or capacitive sensor) (not shown in FIG. 1B) can be used to accurately position the patterning device MA with respect to the path of the radiation beam B (e.g., after mechanical retrieval from a mask library or during a scan). Patterning device MA and substrate W can be aligned using mask alignment marks M1 and M2 and substrate alignment marks P1 and P2.

In general, movement of the support structure MT can be realized with the aid of a long-stroke positioner (coarse positioning) and a short-stroke positioner (fine positioning), which form part of the first positioner PM. Similarly, movement of the substrate table WT can be realized using a long-stroke positioner and a short-stroke positioner, which form part of the second positioner PW. In the case of a stepper (as opposed to a scanner), the support structure MT can be connected to a short-stroke actuator only or can be fixed. Patterning device MA and substrate W can be aligned using mask alignment marks M1 and M2, and substrate alignment marks P1 and P2. Although the substrate alignment marks (as illustrated) occupy dedicated target portions, they can be located in spaces between target portions (e.g., scribe-lane alignment marks). Similarly, in situations in which more than one die is provided on the patterning device MA, the mask alignment marks M1 and M2 can be located between the dies.

Support structure MT and patterning device MA can be in a vacuum chamber V, where an in-vacuum robot can be used to move patterning devices such as a mask in and out of vacuum chamber. Alternatively, when support structure MT and patterning device MA are outside of the vacuum chamber, an out-of-vacuum robot can be used for various transportation operations, similar to the in-vacuum robot. In some instances, both the in-vacuum and out-of-vacuum robots need to be calibrated for a smooth transfer of any payload (e.g., a mask) to a fixed kinematic mount of a transfer station.

In some aspects, the lithographic apparatuses 100 and 100' can be used in at least one of the following modes:

1. In step mode, the support structure MT and the substrate table WT are kept essentially stationary, while an entire pattern imparted to the radiation beam B is projected onto a target portion C at one time (e.g., a single static exposure). The substrate table WT is then shifted in the X and/or Y direction so that a different target portion C can be exposed.

2. In scan mode, the support structure MT and the substrate table WT are scanned synchronously while a pattern imparted to the radiation beam B is projected onto a target portion C (e.g., a single dynamic exposure). The velocity and direction of the substrate table WT relative to the support structure MT (e.g., mask table) can be determined by the (de-)magnification and image reversal characteristics of the projection system PS.

3. In another mode, the support structure MT is kept substantially stationary holding a programmable patterning device MA, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device MA, such as a programmable mirror array.

In some aspects, the lithographic apparatuses 100 and 100' can employ combinations and/or variations of the above-described modes of use or entirely different modes of use.

In some aspects, as shown in FIG. 1A, the lithographic apparatus 100 can include an EUV source configured to generate an EUV radiation beam B for EUV lithography. In general, the EUV source can be configured in a radiation source SO, and a corresponding illumination system IL can be configured to condition the EUV radiation beam B of the EUV source.

Figure 2:
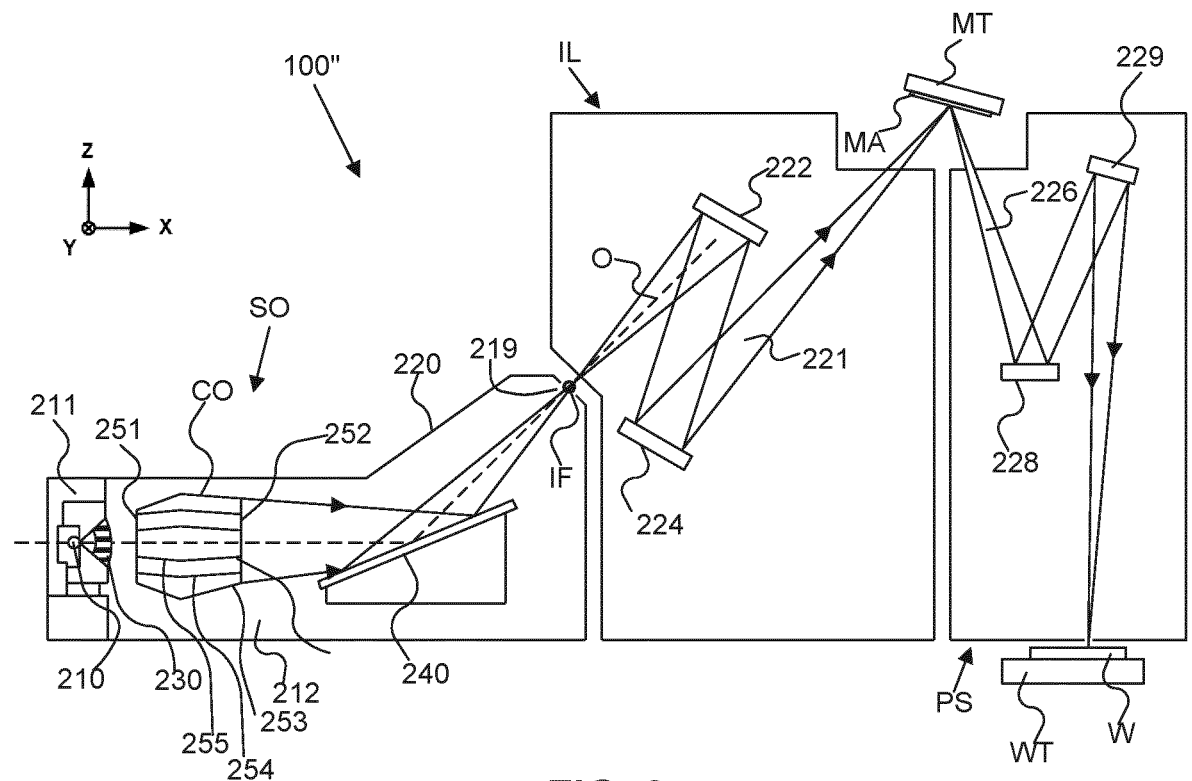
FIG. 2 is a more detailed schematic illustration of the reflective lithographic apparatus shown in FIG. 1A according to some aspects of the present disclosure.

FIG. 2 shows the lithographic apparatus 100 in more detail, including the radiation source SO (e.g., a source collector apparatus), the illumination system IL, and the projection system PS. As shown in FIG. 2, the lithographic apparatus 100 is illustrated from a point of view (e.g., a side view) that is normal to the XZ plane (e.g., the X-axis points to the right and the Z-axis points upward).

The radiation source SO is constructed and arranged such that a vacuum environment can be maintained in an enclosing structure 220. The radiation source SO includes a source chamber 211 and a collector chamber 212 and is configured to produce and transmit EUV radiation. EUV radiation can be produced by a gas or vapor, for example xenon (Xe) gas, lithium (Li) vapor, or tin (Sn) vapor in which an EUV radiation emitting plasma 210 is created to emit radiation in the EUV range of the electromagnetic spectrum. The EUV radiation emitting plasma 210, at least partially ionized, can be created by, for example, an electrical discharge or a laser beam. Partial pressures of, for example, about 10.0 pascals (Pa) of Xe gas, Li vapor, Sn vapor, or any other suitable gas or vapor can be used for efficient generation of the radiation. In some aspects, a plasma of excited tin is provided to produce EUV radiation.

The radiation emitted by the EUV radiation emitting plasma 210 is passed from the source chamber 211 into the collector chamber 212 via an optional gas barrier or contaminant trap 230 (e.g., in some cases also referred to as contaminant barrier or foil trap), which is positioned in or behind an opening in the source chamber 211. The contaminant trap 230 can include a channel structure. Contaminant trap 230 can also include a gas barrier or a combination of a gas barrier and a channel structure. The contaminant trap 230 further indicated herein at least includes a channel structure.

The collector chamber 212 can include a radiation collector CO (e.g., a condenser or collector optic), which can be a so-called grazing incidence collector. Radiation collector CO has an upstream radiation collector side 251 and a downstream radiation collector side 252. Radiation that traverses radiation collector CO can be reflected off a grating spectral filter 240 to be focused in a virtual source point IF. The virtual source point IF is commonly referred to as the intermediate focus, and the source collector apparatus is arranged such that the virtual source point IF is located at or near an opening 219 in the enclosing structure 220. The virtual source point IF is an image of the EUV radiation emitting plasma 210. The grating spectral filter 240 can be used to suppress infrared (IR) radiation.

Subsequently the radiation traverses the illumination system IL, which can include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the radiation beam 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown can generally be present in illumination system IL and projection system PS. Optionally, the grating spectral filter 240 can be present depending upon the type of lithographic apparatus. Further, there can be more mirrors present than those shown in the FIG. 2. For example, there can be one to six additional reflective elements present in the projection system PS than shown in FIG. 2.

Radiation collector CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a radiation collector CO of this type is preferably used in combination with a discharge produced plasma (DPP) source.

Example Lithographic Cell

Figure 3:
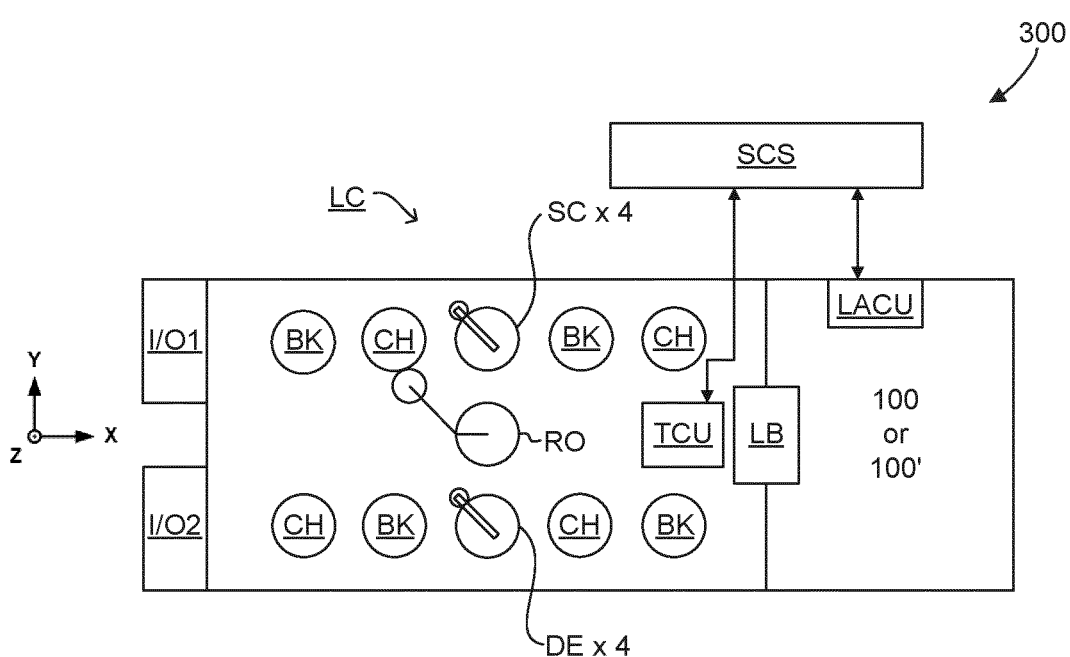
FIG. 3 is a schematic illustration of an example lithographic cell according to some aspects of the present disclosure.

FIG. 3 shows a lithographic cell 300, also sometimes referred to a lithocell or cluster. As shown in FIG. 3, the lithographic cell 300 is illustrated from a point of view (e.g., a top view) that is normal to the XY plane (e.g., the X-axis points to the right and the Y-axis points upward).

Lithographic apparatus 100 or 100' can form part of lithographic cell 300. Lithographic cell 300 can also include one or more apparatuses to perform pre- and post-exposure processes on a substrate. For example, these apparatuses can include spin coaters SC to deposit resist layers, developers DE to develop exposed resist, chill plates CH, and bake plates BK. A substrate handler RO (e.g., a robot) picks up substrates from input/output ports I/O1 and I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses can be operated to maximize throughput and processing efficiency.

Example Metrology System

Figure 4:
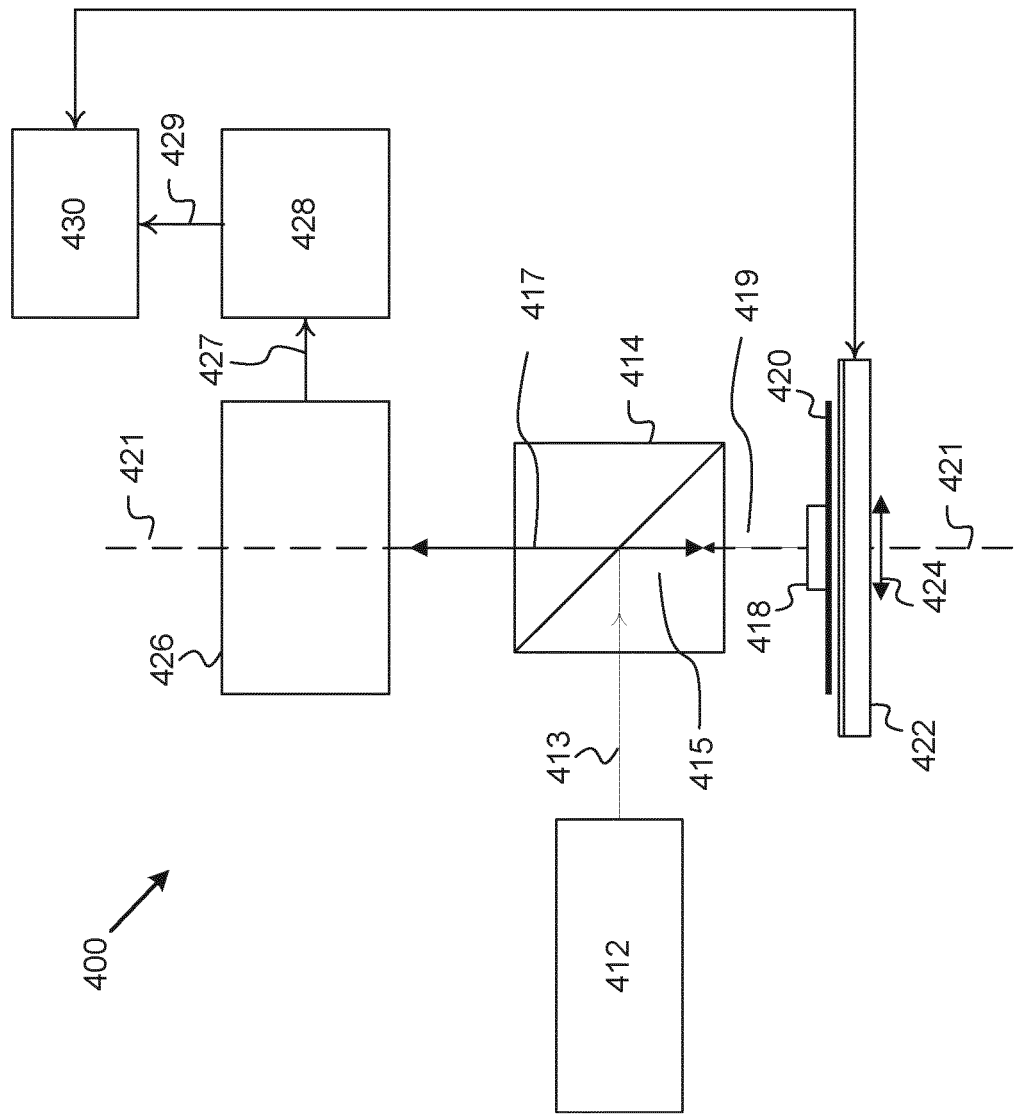
FIG. 4 is a schematic illustration of a metrology system, according to some aspects of the present disclosure.

FIG. 4 illustrates a schematic of a cross-sectional view of a metrology system 400 that can be implemented as a part of lithographic apparatus 100 or 100', according to an embodiment. In an example of this embodiment, metrology system 400 may be configured to align a substrate (e.g., substrate W) with respect to a patterning device (e.g., patterning device MA). Metrology system 400 may be further configured to detect positions of alignment marks on the substrate and to align the substrate with respect to the patterning device or other components of lithography apparatus 100 or 100' using the detected positions of the alignment marks. Such alignment of the substrate may ensure accurate exposure of one or more patterns on the substrate.

According to an embodiment, metrology system 400 may include an illumination system 412, a reflector 414, an interferometer 426, a detector 428, and a controller 430, according an example of this embodiment. Illumination system 412 may be configured to provide a radiation beam 413. Radiation beam 413 may include, for example, an electromagnetic narrow band having one or more passbands. In another example, the one or more passbands may be discrete narrow passbands within a spectrum of wavelengths between about 500 nm to about 900 nm. Illumination system 412 may be further configured to provide one or more passbands having substantially constant center wavelength (CWL) values over a long period of time (e.g., over a lifetime of illumination system 412). Such configuration of illumination system 412 may help to prevent the shift of the actual CWL values from the desired CWL values, as discussed above, in current metrology systems. And, as a result, the use of constant CWL values may increase long-term stability and accuracy of metrology systems (e.g., metrology system 400) compared to the current metrology systems.

Reflector 414 may be configured to receive radiation beam 413 and direct radiation beam 413 towards substrate 420 as radiation beam 415, according an embodiment. Reflector 414 may be a mirror or dichromatic mirror. In one example, stage 422 is moveable along direction 424. Radiation beam 415 may be configured to illuminate a plurality of alignment marks 418 or targets located on substrate 420. In another example, radiation beam 415 is configured to reflect from a surface of substrate 420. The plurality of alignment marks 418 may be coated with a radiation sensitive film in an example of this embodiment. In another example, the plurality of alignment marks 418 may have one hundred and eighty degree symmetry. That is, when one alignment mark in the plurality of alignment marks 418 is rotated one hundred and eighty degrees about an axis of symmetry perpendicular to a plane of another alignment mark in the plurality of alignment marks 418, the rotated alignment mark may be substantially identical to the un-rotated alignment mark.

As illustrated in FIG. 4, interferometer 426 may be configured to receive radiation beam 417. A radiation beam 419 may be diffracted from the plurality of alignment marks 418, or reflected from a surface of substrate 420, and is received at interferometer 426 as radiation beam 417. Interferometer 426 comprises any appropriate set of optical-elements, for example, a combination of prisms that may be configured to form two images of the plurality of alignment marks 418 based on the received radiation beam 417. It should be appreciated that a good quality image need not be formed, but that the features of the plurality of alignment marks 418 should be resolved. Interferometer 426 may be further configured to rotate one of the two images with respect to the other of the two images one hundred and eighty degrees and recombine the two images interferometrically.

In an embodiment, detector 428 may be configured to receive the recombined image and detect an interference as a result of the recombined image when alignment axis 421 of metrology system 400 passes through a center of symmetry (not shown) of the plurality of alignment marks 418. Such interference may be due to the plurality of alignment marks 418 being one hundred and eighty degree symmetrical, and the recombined image interfering constructively or destructively, according to an example embodiment. Based on the detected interference, detector 428 may be further configured to determine a position of the center of symmetry of the plurality of alignment marks 418 and consequently, detect a position of substrate 420. According to an example, alignment axis 421 may be aligned with an optical beam perpendicular to substrate 420 and passing through a center of image rotation interferometer 426. In another example, detector 428 is configured to receive the recombined image and detect an interference of light being reflected off a surface of substrate 420.

In a further embodiment, controller 430 may be configured to receive a measurement data signal 429 including measurement data. Measurement data can include, but is not limited to, electronic information indicative of the determined center of symmetry. Controller 430 may be further configured to determine a position of stage 422 and correlate the position of stage 422 with the position of the center of symmetry of the plurality of alignment marks 418. As such, the positions of the plurality of alignment marks 418 and consequently, the position of substrate 420 may be accurately determined with reference to stage 422. Alternatively, controller 430 may be configured to determine a position of metrology system 400 or any other reference element such that the center of symmetry of the plurality of alignment marks 418 may be determined with reference to metrology system 400 or any other reference element.

In an embodiment, controller 430 is configured to apply a correction to a measurement received from detector 428 to account for asymmetry that can exist in the plurality of alignment marks 418. The asymmetry can exist due to imperfections in the structure of the mark itself (e.g., sidewall angle, critical dimension spacing, etc.) or due to non-linear optical effects based on the wavelength of light being directed towards the plurality of alignment marks 418.

It should be noted that even though reflector 414 is shown to direct radiation beam 413 towards the plurality of alignment marks 418 as radiation beam 415, the disclosure is not so limiting. It would be apparent to a person skilled in the relevant art that other optical arrangements may be used to obtain the similar result of illuminating the plurality of alignment marks 418 on substrate 420 and detecting an image of the plurality of alignment marks 418. Reflector 414 may direct the illumination in a direction normal to the surface of substrate 420, or at an angle.

As a foundation for some aspects, the metrology system 400 can include an illumination system 412 configured to generate a radiation beam 413. In some aspects, the radiation beam 413 generated by the illumination system 412 can include a plurality of wavelengths. In some aspects, the radiation beam 413 generated by the illumination system 412 can include a plurality of polarization phases. The metrology system 400 can further include a reflector 414 configured to direct the radiation beam 413 towards a substrate 420 (e.g., in the form of radiation beam 415). The metrology system 400 can further include an interferometer 426 configured to receive a radiation beam 417 diffracted from a plurality of alignment marks 418 disposed on the substrate 420 or reflected from the substrate 420 (e.g., in the form of radiation beam 419). The interferometer 426 can be further configured to generate an output radiation beam 427 from an interference between the diffracted or reflected radiation beam 417. The metrology system 400 can further include a detector 428 configured to receive the output radiation beam 427 from the interferometer 426. The detector 428 can be further configured to generate a measurement data signal 429 (e.g., $APD(\lambda,x,y)$) based on the received output radiation beam 427.

The metrology system 400 can further include a controller 430 configured to generate substrate deformation data (e.g., $APD_{WD}(x,y)$) based on the measurement data signal 429. The controller 430 can be further configured to generate alignment mark deformation data (e.g., $APD_{MD}(\lambda,x,y)$) based on the measurement data signal 429. The alignment mark deformation data can include alignment mark deformation spectral pattern data (e.g., $c_i(\lambda)$), alignment mark deformation amplitude data (e.g., $MD_i(x,y)$), and alignment mark deformation offset data (e.g., $s_{avg,i}$). The controller 430 can be further configured to generate a correction to the measurement data signal 429 based on the substrate deformation data and the alignment mark deformation data.

In some aspects, the controller 430 can be configured to generate the alignment mark deformation data based on a similarity value of spectral and polarization patterns of the measurement data signal 429 to a set of reduced-dimensionality basis functions representing different modes of mark asymmetry (e.g., based on the spectral and polarization patterns of the measurement data signal 429 and their similarity to a family of reduced-dimensionality basis functions representing different modes of mark asymmetry). In one illustrative and non-limiting example, the controller 430 can be configured to generate the alignment mark deformation data based on a principle components analysis of the measurement data signal 429. In some aspects, the measurement data signal 429 can include a plurality of spectral patterns indicative of alignment mark deformation, and the controller 430 can be configured to: determine, from among the plurality of spectral patterns, a subset of dominant spectral patterns to use in a determination of the alignment mark deformation spectral pattern data, and determine the alignment mark deformation spectral pattern data further based on the subset of dominant spectral patterns.

In some aspects, the alignment mark deformation amplitude data can be proportional to an alignment mark asymmetry map. The alignment mark asymmetry map may be, for example, a wavelength-independent, two-dimensional map (e.g., generated based on $MD_i(x,y)$) that includes a respective amplitude of each reduced-dimensionality basis function in the set of reduced-dimensionality basis functions. In some aspects, the controller 430 can be further configured to separate the spatial distribution of alignment mark deformation from the total deformation by fitting a scalar value with the alignment mark asymmetry map together with other functions to represent substrate deformation. In some aspects, the controller 430 can be further configured to generate a reference wavelength and generate the alignment mark deformation offset data (or, in some aspects, the total substrate and alignment mark deformation offset data) further based on the reference wavelength. In some aspects, the reference wavelength can correspond to an average wavelength or color.

Figure 5:
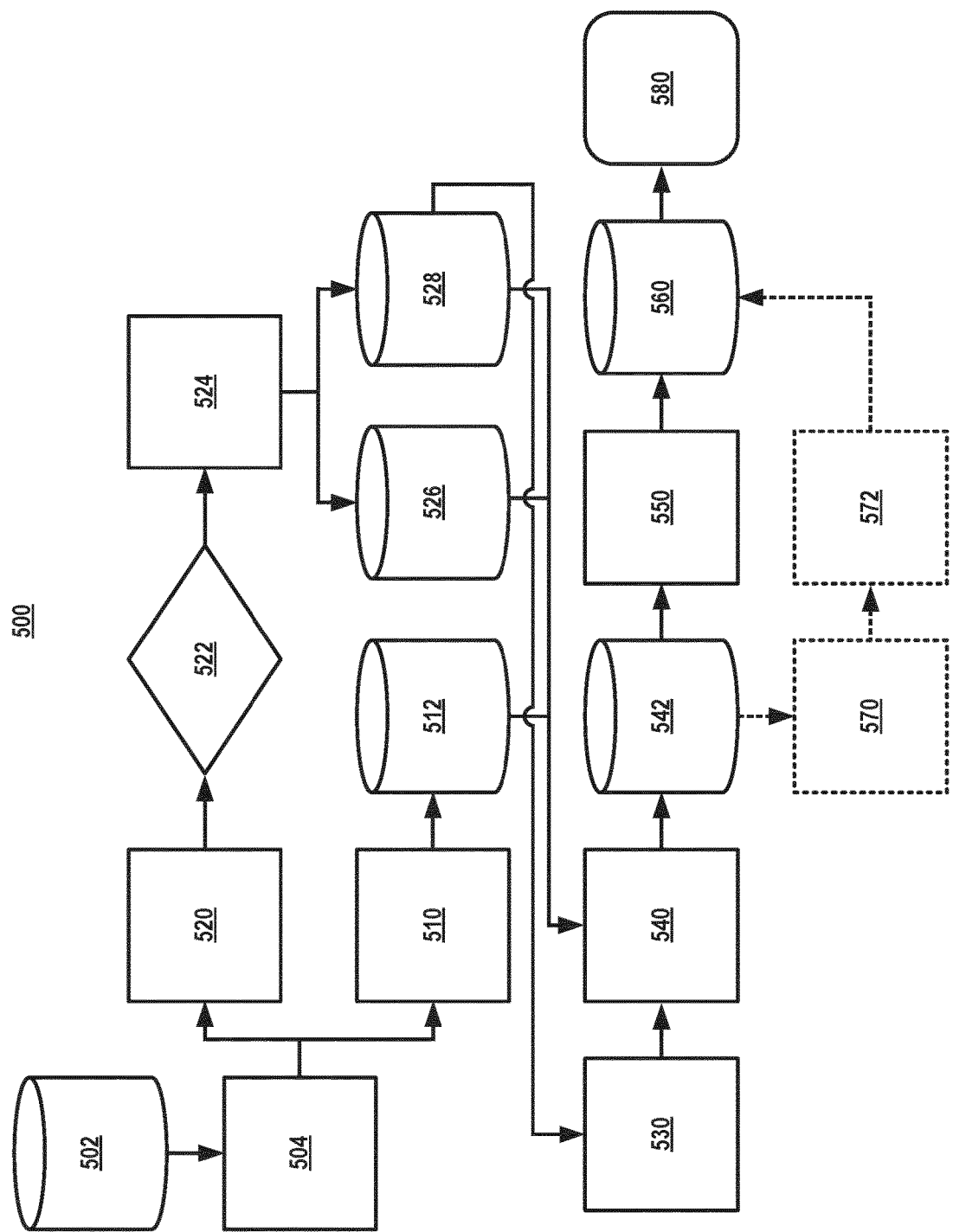
FIG. 5 is a schematic illustration of an example process flow for correcting the detected positions of alignment marks disposed on a substrate according to some aspects of the present disclosure.

FIG. 5 is a schematic illustration of an example process flow 500 for correcting the detected positions of alignment marks disposed on a substrate according to some aspects of the present disclosure. The operations described with reference to example process flow 500 can be performed by, or according to, any of the systems, apparatuses, components, techniques, or combinations thereof described herein, such as those described with reference to FIGS. 1-4 above and FIGS. 6-10 below.

At 504, process flow 500 receives measurement data 502 (e.g., $APD(\lambda,x,y)$) corresponding to measurements for multiple alignment marks on one or more wafers. At 510, process flow 500 generates substrate deformation data 512 (e.g., $APD_{WD}(x,y)$) based on the measurement data 502. At 520, process flow 500 uses PCA, or another suitable technique, to separate spectral patterns (e.g., $c(\lambda)$) and their amplitudes (e.g., $MD(x,y)$) with respect to an average color (e.g., $\lambda$). At 522, process flow 500 determines a number N of dominant patterns to use (e.g., N=1, N=2, N=1), where an index i is an integer value greater than or equal to 1 and less than or equal to N. At 524, process flow 500 determines N dominant spectral shapes and their amplitudes (e.g., a spatial distribution of mark deformation), including alignment mark deformation spectral pattern data 526 (e.g., $c_i(\lambda)$) and alignment mark deformation amplitude data 528 (e.g., $MD_i(x,y)$). At 530, process flow 500 extends the wafer alignment model (e.g., the AEGM technique) using the alignment mark deformation amplitude data 528 as shown in Equation 3:

$$APD_{meas} = [1 \ x \ y \ MD] \begin{bmatrix} p_1 \\ p_2 \\ p_3 \\ s_{avg} \end{bmatrix} = \quad (3)$$

$$p_1 + p_2 x + p_3 y + MD \cdot s_{avg} = APD_{WD} + APD_{MD}$$

In Equation 3, the terms 1, x, y, $p_1$, $p_2$, and $p_3$ correspond to the wafer deformation model, while the terms MD and $s_{avg}$ correspond to the alignment mark deformation model.

At 540, process flow 500 fits wafer deformation and alignment mark deformation at substantially the same time to determine alignment mark deformation offset data 542 (e.g., $s_{avg,i}$). At 550, process flow 500 uses alignment mark deformation offset data 542 to determine and remove the alignment mark deformation from the measurement data 502 with respect to the average color, the output of which is corrected measurement data 560. Subsequently, at 580, process flow 500 performs wafer alignment based on the corrected measurement data 560.

Optionally, at 570, process flow 500 converts the corrected measurement data 560 to color weights using an optimal color weighting (OCW) technique. In some aspects, the OCW technique may be modified based on overlay training using an AEGM machine learning model trained on a set of training wafers. Optionally, at 572, process flow 500 applies color weights to all measured alignment marks to generate the corrected measurement data 560.

Figure 6:
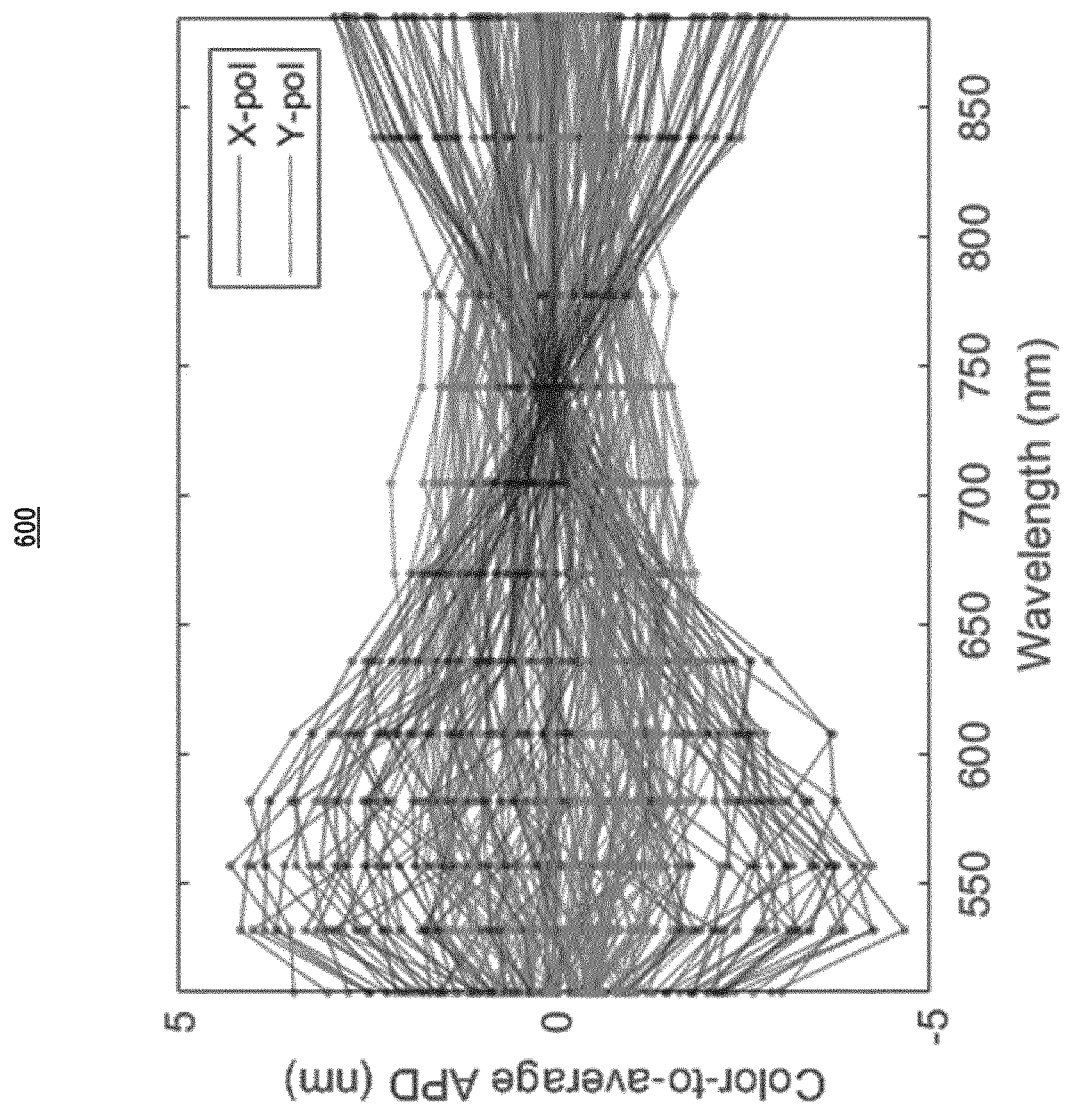
FIG. 6 is a representation of example measurement data according to some aspects of the present disclosure.

FIG. 6 is a graphical representation of example measurement data 600 according to some aspects of the present disclosure. As shown in FIG. 6, example measurement data 600 includes measured spectral pattern data for a plurality of alignment marks. In some aspects, example measurement data 600 includes color-to-average APD values (nm) for a plurality of wavelengths (nm) and two different polarizations ("X-pol" and "Y-pol").

Figure 7:
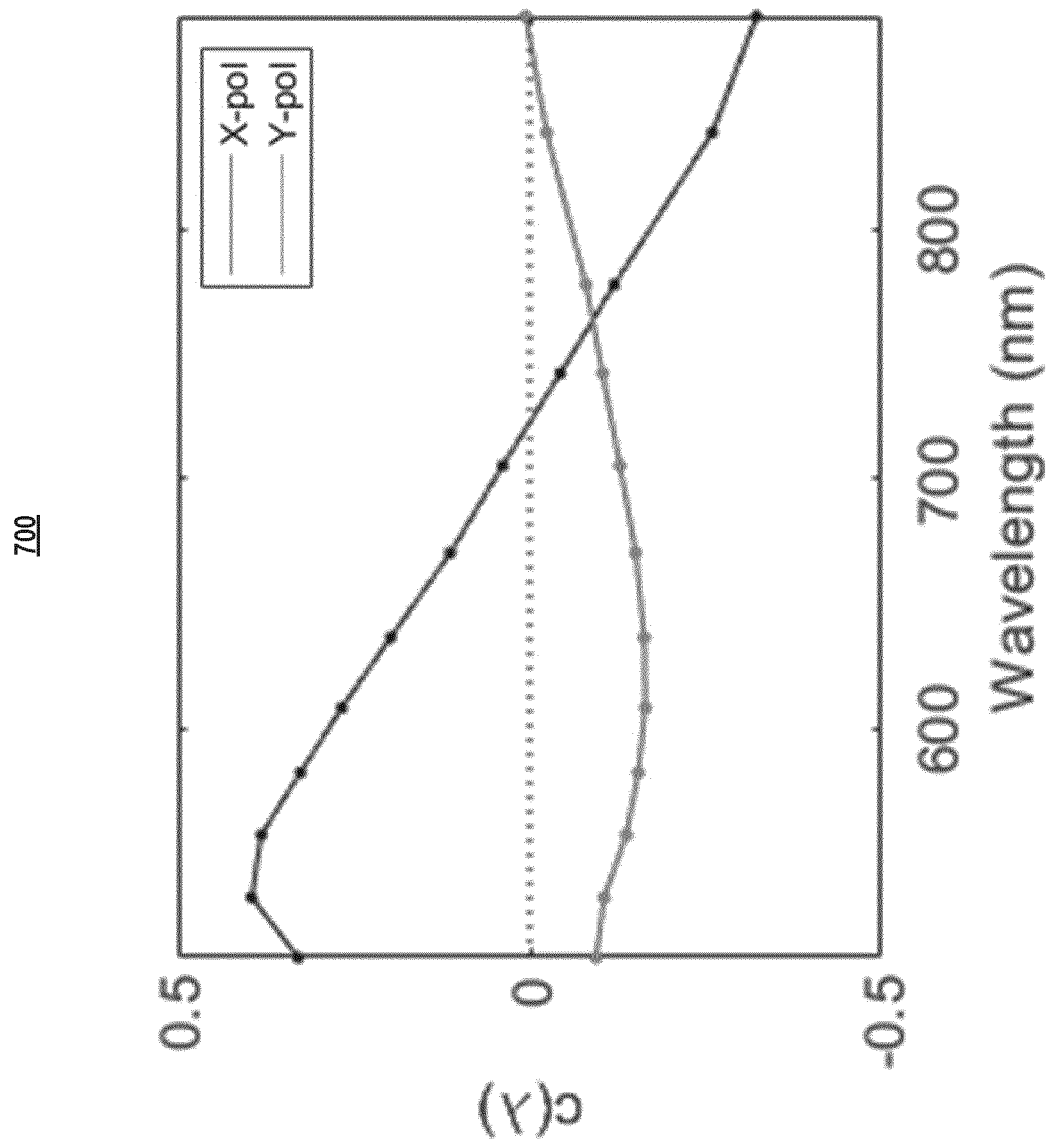
FIG. 7 is a representation of example alignment mark deformation spectral pattern data according to some aspects of the present disclosure.

FIG. 7 is a graphical representation of example alignment mark deformation spectral pattern data 700 according to some aspects of the present disclosure. As shown in FIG. 7, example alignment mark deformation spectral pattern data 700 includes modified spectral pattern data (e.g., reduced using PCA or another suitable technique) for a plurality of alignment marks. In some aspects, example alignment mark deformation spectral pattern data 700 includes spectral patterns $c(\lambda)$ for a dominant asymmetry mode (e.g., N=1) as a function of wavelength (nm) and polarization ("X-pol" and "Y-pol").

Figure 8:
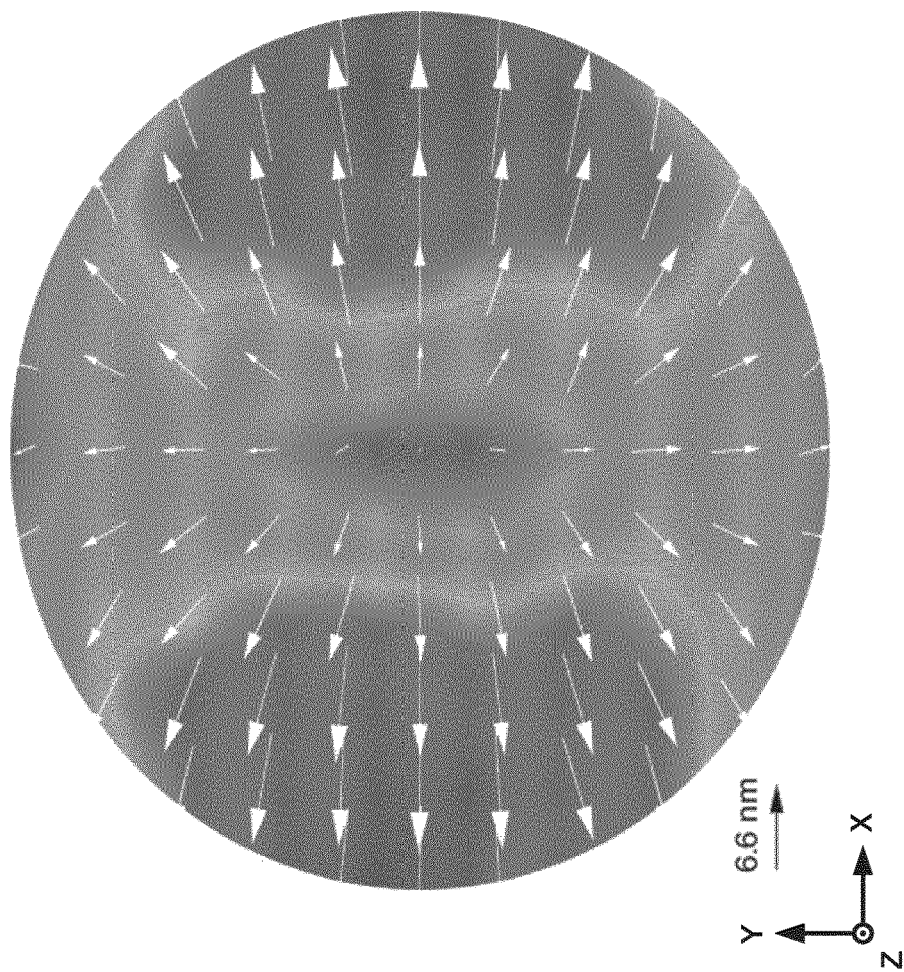
FIG. 8 is a representation of example alignment mark deformation amplitude data according to some aspects of the present disclosure.

FIG. 8 is a graphical representation of example alignment mark deformation amplitude data 800 according to some aspects of the present disclosure. As shown in FIG. 8, example alignment mark deformation amplitude data 800 includes the alignment mark deformation amplitudes $MD(x,y)$ of spectral patterns $c(\lambda)$. In some aspects, the "mean+3σ" x value can be about 18.6 nm and the "mean+3σ" y value can be about 7.46 nm. In some aspects, the graphical representation of example alignment mark deformation amplitude data 800 shown in FIG. 8 can be referred to as an "alignment mark asymmetry map."

Example Processes for Correcting the Detected Positions of Alignment Marks

Figure 9:
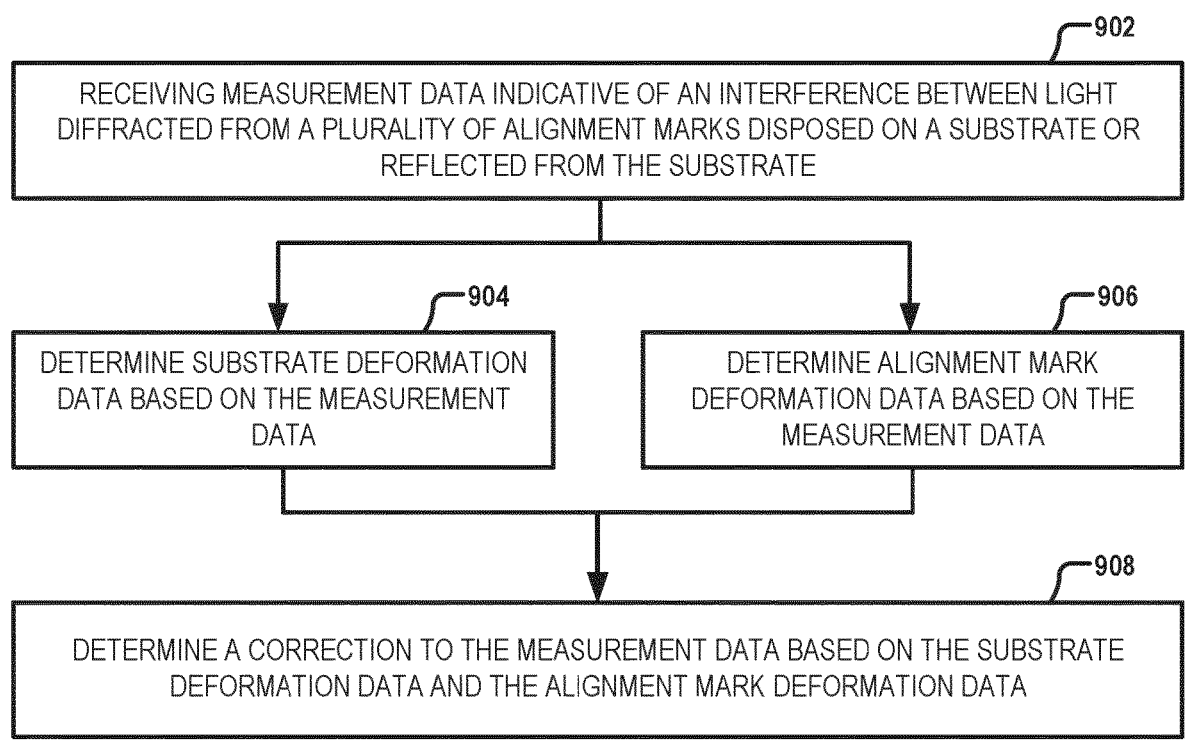
FIG. 9 is an example method for correcting the detected positions of alignment marks disposed on a substrate according to some aspects of the present disclosure or portion(s) thereof.

FIG. 9 is an example method 900 for correcting the detected positions of alignment marks disposed on a substrate according to some aspects of the present disclosure or portion(s) thereof. The operations described with reference to example method 900 can be performed by, or according to, any of the systems, apparatuses, components, techniques, or combinations thereof described herein, such as those described with reference to FIGS. 1-8 above and FIG. 10 below.

At operation 902, the method can include receiving (e.g., by controller 430 of metrology system 400) measurement data (e.g., measurement data signal 429, measurement data 600) indicative of an interference between light diffracted from a plurality of alignment marks disposed on a substrate or reflected from the substrate. In some aspects, the diffracted or reflected light can include a plurality of wavelengths. In some aspects, the diffracted or reflected light can include a plurality of polarization phases. In some aspects, the receiving of the measurement data can be accomplished using suitable mechanical or other methods and include receiving the measurement data in accordance with any aspect or combination of aspects described with reference to FIGS. 1-8 above and FIG. 10 below.

At operation 904, the method can include determining (e.g., by controller 430) substrate deformation data (e.g., substrate deformation data 512, $APD_{WD}(x,y)$) based on the measurement data. In some aspects, the determining of the substrate deformation data can be accomplished using suitable mechanical or other methods and include determining the substrate deformation data in accordance with any aspect or combination of aspects described with reference to FIGS. 1-8 above and FIG. 10 below.

At operation 906, the method can include determining (e.g., by controller 430) alignment mark deformation data (e.g., alignment mark deformation data $APD_{MD}(\lambda,x,y)$) based on the measurement data. The alignment mark deformation data can include, for example, alignment mark deformation spectral pattern data (e.g., alignment mark deformation spectral pattern data 526, 700, $c_i(\lambda)$), alignment mark deformation amplitude data (e.g., alignment mark deformation amplitude data 528, 800, $MD_i(x,y)$), and alignment mark deformation offset data (e.g., alignment mark deformation offset data 542, $s_{avg,i}$). In some aspects, the determining the alignment mark deformation data can include determining the alignment mark deformation data based on a similarity value of spectral and polarization patterns of the measurement data to a set of reduced-dimensionality basis functions representing different modes of mark asymmetry (e.g., based on the spectral and polarization patterns of the measurement data and their similarity to a family of reduced-dimensionality basis functions representing different modes of mark asymmetry). For example, the determining the alignment mark deformation data can include determining the alignment mark deformation data based on a principle components analysis of the measurement data or any other suitable technique for picking a small number of basis functions from large datasets. In another example, the measurement data can include a plurality of spectral patterns indicative of alignment mark deformation, and the determining the alignment mark deformation data can include: determining (e.g., by controller 430), from among the plurality of spectral patterns, a subset of dominant spectral patterns to use in a determination of the alignment mark deformation spectral pattern data; and determining (e.g., by controller 430) the alignment mark deformation spectral pattern data further based on the subset of dominant spectral patterns.

In some aspects, the alignment mark deformation amplitude data can be proportional to an alignment mark asymmetry map (e.g., a wavelength-independent, two-dimensional map) that includes a respective amplitude of each reduced-dimensionality basis function in the set of reduced-dimensionality basis functions. In other words, the alignment mark deformation amplitude data can be proportional to a wavelength-independent, two-dimensional map of the amplitude of each asymmetry mode basis function. In some aspects, the method can further include separating the spatial distribution of alignment mark deformation from the total deformation by fitting a scalar value with the alignment mark asymmetry map together with other functions to represent substrate deformation. Optionally, in some aspects, the method can further include determining (e.g., by controller 430) a reference wavelength and determining the alignment mark deformation offset data (or, in some aspects, the total substrate and alignment mark deformation offset data) further based on the reference wavelength. In some aspects, the reference wavelength can correspond to an average wavelength. In some aspects, the determining of the alignment mark deformation data can be accomplished using suitable mechanical or other methods and include determining the alignment mark deformation data in accordance with any aspect or combination of aspects described with reference to FIGS. 1-8 above and FIG. 10 below.

At operation 908, the method can include determining (e.g., by controller 430) a correction (e.g., corrected measurement data 560) to the measurement data based on the substrate deformation data and the alignment mark deformation data. In some aspects, the determining of the correction can be accomplished using suitable mechanical or other methods and include determining the correction in accordance with any aspect or combination of aspects described with reference to FIGS. 1-8 above and FIG. 10 below.

Optionally, in some aspects, the method can further include modifying the alignment mark deformation data using an AEGM machine learning model trained on a set of training wafers by a process that includes, among other operations: (i) permitting the respective substrate deformation data to vary for each training wafer in the set of training wafers; (ii) fitting alignment mark deformation data on each training wafer in the set of training wafers while keeping the $s_{avg}$ term constant across all training wafers in the set of training wafers; and (iii) refitting the fitted alignment mark deformation data for each alignment mark disposed on each wafer in the set of training wafers to generate modified alignment mark deformation data. In some aspects, the method can further include determining the correction to the measurement data signal based on the substrate deformation data and the modified alignment mark deformation data.

Example Computing System

Aspects of the disclosure can be implemented in hardware, firmware, software, or any combination thereof. Aspects of the disclosure can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical, or other forms of propagated signals (e.g., carrier waves, infrared signals, digital signals, etc.), and others. Further, firmware, software, routines, instructions, and combinations thereof can be described herein as performing certain actions. However, it should be appreciated that such descriptions are merely for convenience and that such actions in fact result from computing devices, processors, controllers, or other devices executing the firmware, software, routines, instructions, or combinations thereof and, in doing so, causing actuators or other devices (e.g., servo motors, robotic devices) to interact with the physical world.

Figure 10:
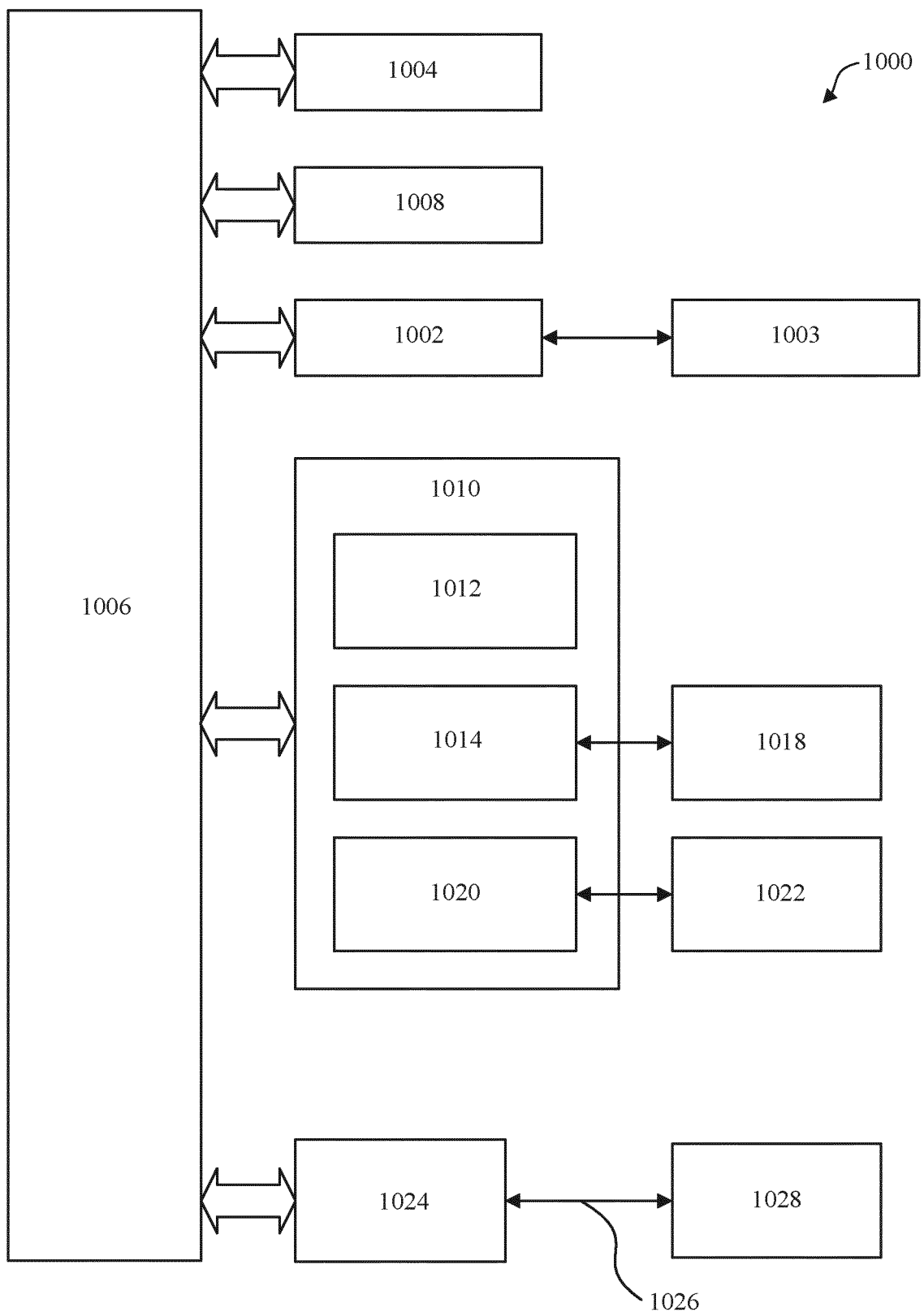
FIG. 10 is an example computer system for implementing some aspects of the present disclosure or portion(s) thereof.

Various aspects can be implemented, for example, using one or more computing systems, such as example computing system 1000 shown in FIG. 10. Example computing system 1000 can be a specialized computer capable of performing the functions described herein such as: the metrology system 400 described with reference to FIG. 4; any other suitable system, sub-system, or component; or any combination thereof. Example computing system 1000 can include one or more processors (also called central processing units, or CPUs), such as a processor 1004. Processor 1004 is connected to a communication infrastructure 1006 (e.g., a bus). Example computing system 1000 can also include user input/output device(s) 1003, such as monitors, keyboards, pointing devices, etc., that communicate with communication infrastructure 1006 through user input/output interface(s) 1002. Example computing system 1000 can also include a main memory 1008 (e.g., one or more primary storage devices), such as random access memory (RAM). Main memory 1008 can include one or more levels of cache. Main memory 1008 has stored therein control logic (e.g., computer software) and/or data.

Example computing system 1000 can also include a secondary memory 1010 (e.g., one or more secondary storage devices). Secondary memory 1010 can include, for example, a hard disk drive 1012 and/or a removable storage drive 1014. Removable storage drive 1014 can be a floppy disk drive, a magnetic tape drive, a compact disk drive, an optical storage device, tape backup device, and/or any other storage device/drive.

Removable storage drive 1014 can interact with a removable storage unit 1018. Removable storage unit 1018 includes a computer usable or readable storage device having stored thereon computer software (control logic) and/or data. Removable storage unit 1018 can be a floppy disk, magnetic tape, compact disk, DVD, optical storage disk, and/or any other computer data storage device. Removable storage drive 1014 reads from and/or writes to removable storage unit 1018.

According to some aspects, secondary memory 1010 can include other means, instrumentalities or other approaches for allowing computer programs and/or other instructions and/or data to be accessed by example computing system 1000. Such means, instrumentalities or other approaches can include, for example, a removable storage unit 1022 and an interface 1020. Examples of the removable storage unit 1022 and the interface 1020 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Example computing system 1000 can further include a communications interface 1024 (e.g., one or more network interfaces). Communications interface 1024 enables example computing system 1000 to communicate and interact with any combination of remote devices, remote networks, remote entities, etc. (individually and collectively referred to as remote devices 1028). For example, communications interface 1024 can allow example computing system 1000 to communicate with remote devices 1028 over communications path 1026, which can be wired and/or wireless, and which can include any combination of LANs, WANs, the Internet, etc. Control logic, data, or both can be transmitted to and from example computing system 1000 via communications path 1026.

The operations in the preceding aspects of the present disclosure can be implemented in a wide variety of configurations and architectures. Therefore, some or all of the operations in the preceding aspects can be performed in hardware, in software or both. In some aspects, a tangible, non-transitory apparatus or article of manufacture includes a tangible, non-transitory computer useable or readable medium having control logic (software) stored thereon is also referred to herein as a computer program product or program storage device. This includes, but is not limited to, example computing system 1000, main memory 1008, secondary memory 1010 and removable storage units 1018 and 1022, as well as tangible articles of manufacture embodying any combination of the foregoing. Such control logic, when executed by one or more data processing devices (such as example computing system 1000), causes such data processing devices to operate as described herein.

Based on the teachings contained in this disclosure, it will be apparent to persons skilled in the relevant art(s) how to make and use aspects of the disclosure using data processing devices, computer systems and/or computer architectures other than that shown in FIG. 10. In particular, aspects of the disclosure can operate with software, hardware, and/or operating system implementations other than those described herein.

The embodiments may further be described using the following clauses:

1. A metrology system, comprising:
   an illumination system configured to generate light;
   a reflector configured to direct the light towards a substrate;
   an interferometer configured to:
     receive light diffracted from a plurality of alignment marks disposed on the substrate or reflected from the substrate, and
     generate output light from an interference between the received light;
   a detector configured to:
     receive the output light from the interferometer, and
     generate a measurement data signal based on the received output light; and
   a controller configured to:
     determine substrate deformation data based on the measurement data signal,
     determine alignment mark deformation data based on the measurement data signal, wherein the alignment mark deformation data comprises alignment mark deformation spectral pattern data, alignment mark deformation amplitude data, and alignment mark deformation offset data, and
     determine a correction to the measurement data signal based on the substrate deformation data and the alignment mark deformation data.

2. The metrology system of clause 1, wherein the light generated by the illumination system comprises a plurality of wavelengths.

3. The metrology system of clause 1, wherein the light generated by the illumination system comprises a plurality of polarization phases.

4. The metrology system of clause 1, wherein the controller is configured to determine the alignment mark deformation data based on a similarity value of spectral and polarization patterns of the measurement data signal to a set of reduced-dimensionality basis functions representing different modes of mark asymmetry.

5. The metrology system of clause 4, wherein the alignment mark deformation amplitude data is proportional to an alignment mark asymmetry map comprising a respective amplitude of each reduced-dimensionality basis function in the set of reduced-dimensionality basis functions.

6. The metrology system of clause 1, wherein the controller is further configured to:
   determine a reference wavelength, and
   determine the alignment mark deformation offset data further based on the reference wavelength,
   wherein the reference wavelength corresponds to an average wavelength.

7. The metrology system of clause 1, wherein the controller is further configured to:
   modify the alignment mark deformation data using an asymmetry extended grid model (AEGM) machine learning model trained on a set of training wafers by a process comprising:
      fitting alignment mark deformation data on each training wafer in the set of training wafers, and
      refitting the fitted alignment mark deformation data for each alignment mark disposed on each wafer in the set of training wafers to generate modified alignment mark deformation data; and
   determine the correction to the measurement data signal based on the substrate deformation data and the modified alignment mark deformation data.

8. A lithographic apparatus, comprising:
   an illumination system configured to illuminate a pattern of a patterning device;
   a projection system configured to project an image of the pattern onto a target portion of a substrate; and
   a metrology system comprising:
      an illumination subsystem configured to generate light;
      a reflector configured to direct the light towards the substrate;
      an interferometer configured to:
         receive light diffracted from a plurality of alignment marks disposed on the substrate or reflected from the substrate, and
         generate output light from an interference between the received light;
      a detector configured to:
         receive the output light from the interferometer, and
         generate a measurement data signal based on the received output light; and a controller configured to:
            determine substrate deformation data based on the measurement data signal,
            determine alignment mark deformation data based on the measurement data signal, wherein the alignment mark deformation data comprises alignment mark deformation spectral pattern data, alignment mark deformation amplitude data, and alignment mark deformation offset data, and
            determine a correction to the measurement data signal based on the substrate deformation data and the alignment mark deformation data.

9. The lithographic apparatus of clause 8, wherein the light generated by the illumination subsystem comprises a plurality of wavelengths.

10. The lithographic apparatus of clause 8, wherein the light generated by the illumination subsystem comprises a plurality of polarization phases.

11. The lithographic apparatus of clause 8, wherein the controller is configured to determine the alignment mark deformation data based on a similarity value of spectral and polarization patterns of the measurement data signal to a set of reduced-dimensionality basis functions representing different modes of mark asymmetry.

12. The lithographic apparatus of clause 11, wherein the alignment mark deformation amplitude data is proportional to an alignment mark asymmetry map comprising a respective amplitude of each reduced-dimensionality basis function in the set of reduced-dimensionality basis functions.

13. The lithographic apparatus of clause 8, wherein the controller is further configured to:
   determine a reference wavelength, and
   determine the alignment mark deformation offset data further based on the reference wavelength,
   wherein the reference wavelength corresponds to an average wavelength.

14. The lithographic apparatus of clause 8, wherein the controller is further configured to:
   refit the alignment mark deformation data using an asymmetry extended grid model (AEGM) machine learning model trained on a set of training wafers by a process comprising:
      varying respective substrate deformation data for each training wafer in the set of training wafers,
      fitting alignment mark deformation data on each training wafer in the set of training wafers, and
      refitting the fitted alignment mark deformation data for each alignment mark disposed on each wafer in the set of training wafers to generate modified alignment mark deformation data; and
   determine the correction to the measurement data signal based on the substrate deformation data and the modified alignment mark deformation data.

15. A method, comprising:
   receiving measurement data indicative of an interference between light diffracted from a plurality of alignment marks disposed on a substrate or reflected from the substrate;
   determining substrate deformation data based on the measurement data;
   determining alignment mark deformation data based on the measurement data, wherein the alignment mark deformation data comprises alignment mark deformation spectral pattern data, alignment mark deformation amplitude data, and alignment mark deformation offset data; and
   determining a correction to the measurement data based on the substrate deformation data and the alignment mark deformation data.

16. The method of clause 15, wherein the received light comprises a plurality of wavelengths.

17. The method of clause 15, wherein the received light comprises a plurality of polarization phases.

18. The method of clause 15, wherein the determining the alignment mark deformation data comprises determining the alignment mark deformation data based on a similarity value of spectral and polarization patterns of the measurement data to a set of reduced-dimensionality basis functions representing different modes of mark asymmetry.

19. The method of clause 18, wherein the alignment mark deformation amplitude data is proportional to an alignment mark asymmetry map comprising a respective amplitude of each reduced-dimensionality basis function in the set of reduced-dimensionality basis functions.

20. The method of clause 15, wherein the method further comprises:
   determining a reference wavelength; and
   determining the alignment mark deformation offset data further based on the reference wavelength, wherein the reference wavelength corresponds to an average wavelength.

Although specific reference may be made in this text to the use of lithographic apparatus in the manufacture of ICs, it should be understood that the lithographic apparatuses described herein can have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein can be processed, before or after exposure, in for example a track unit (a tool that applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some aspects, the substrate itself can be patterned and materials added on top of it can also be patterned, or can remain without patterning.

The examples disclosed herein are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

While specific aspects of the disclosure have been described above, it will be appreciated that the aspects can be practiced otherwise than as described. The description is not intended to limit the embodiments of the disclosure.

It is to be appreciated that the Detailed Description section, and not the Background, Summary, and Abstract sections, is intended to be used to interpret the claims. The Summary and Abstract sections may set forth one or more but not all example embodiments as contemplated by the inventor(s), and thus, are not intended to limit the present embodiments and the appended claims in any way.

Some aspects of the disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific aspects of the disclosure will so fully reveal the general nature of the aspects that others can, by applying knowledge within the skill of the art, readily modify and/or adapt for various applications such specific aspects, without undue experimentation, without departing from the general concept of the present disclosure. Therefore, such adaptations and modifications are intended to be within the meaning and range of equivalents of the disclosed aspects, based on the teaching and guidance presented herein.

The breadth and scope of the present disclosure should not be limited by any of the above-described example aspects or embodiments, but should be defined only in accordance with the following claims and their equivalents.

The invention claimed is:

1. A metrology system, comprising:
an illumination system configured to generate light;
a reflector configured to direct the light towards a substrate;
an interferometer configured to:
receive light diffracted from a plurality of alignment marks disposed on the substrate or reflected from the substrate, and
generate output light from an interference between the received light;
a detector configured to:
receive the output light from the interferometer, and
generate a measurement data signal based on the received output light; and a controller configured to:
determine substrate deformation data based on the measurement data signal,
determine alignment mark deformation data based on the measurement data signal, wherein the alignment mark deformation data comprises alignment mark deformation spectral pattern data, alignment mark deformation amplitude data, and alignment mark deformation offset data, and
determine a correction to the measurement data signal based on the substrate deformation data and the alignment mark deformation data.

2. The metrology system of claim 1, wherein the light generated by the illumination system comprises a plurality of wavelengths.

3. The metrology system of claim 1, wherein the light generated by the illumination system comprises a plurality of polarization phases.

4. The metrology system of claim 1, wherein the controller is configured to determine the alignment mark deformation data based on a similarity value of spectral and polarization patterns of the measurement data signal to a set of reduced-dimensionality basis functions representing different modes of mark asymmetry.

5. The metrology system of claim 4, wherein the alignment mark deformation amplitude data is proportional to an alignment mark asymmetry map comprising a respective amplitude of each reduced-dimensionality basis function in the set of reduced-dimensionality basis functions.

6. The metrology system of claim 1, wherein the controller is further configured to:
determine a reference wavelength, and
determine the alignment mark deformation offset data further based on the reference wavelength,
wherein the reference wavelength corresponds to an average wavelength.

7. The metrology system of claim 1, wherein the controller is further configured to:
modify the alignment mark deformation data using an asymmetry extended grid model (AEGM) machine learning model trained on a set of training wafers by a process comprising:
fitting alignment mark deformation data on each training wafer in the set of training wafers, and
refitting the fitted alignment mark deformation data for each alignment mark disposed on each wafer in the set of training wafers to generate modified alignment mark deformation data; and determine the correction to the measurement data signal based on the substrate deformation data and the modified alignment mark deformation data.

8. A lithographic apparatus, comprising:
an illumination system configured to illuminate a pattern of a patterning device;
a projection system configured to project an image of the pattern onto a target portion of a substrate; and
a metrology system comprising:
an illumination subsystem configured to generate light;
a reflector configured to direct the light towards the substrate;
an interferometer configured to:
receive light diffracted from a plurality of alignment marks disposed on the substrate or reflected from the substrate, and
generate output light from an interference between the received light;
a detector configured to:
receive the output light from the interferometer, and
generate a measurement data signal based on the received output light; and
a controller configured to:
determine substrate deformation data based on the measurement data signal,
determine alignment mark deformation data based on the measurement data signal, wherein the alignment mark deformation data comprises alignment mark deformation spectral pattern data, alignment mark deformation amplitude data, and alignment mark deformation offset data, and
determine a correction to the measurement data signal based on the substrate deformation data and the alignment mark deformation data.

9. The lithographic apparatus of claim 8, wherein the light generated by the illumination subsystem comprises a plurality of wavelengths.

10. The lithographic apparatus of claim 8, wherein the light generated by the illumination subsystem comprises a plurality of polarization phases.

11. The lithographic apparatus of claim 8, wherein the controller is configured to determine the alignment mark deformation data based on a similarity value of spectral and polarization patterns of the measurement data signal to a set of reduced-dimensionality basis functions representing different modes of mark asymmetry.

12. The lithographic apparatus of claim 11, wherein the alignment mark deformation amplitude data is proportional to an alignment mark asymmetry map comprising a respective amplitude of each reduced-dimensionality basis function in the set of reduced-dimensionality basis functions.

13. The lithographic apparatus of claim 8, wherein the controller is further configured to:
determine a reference wavelength, and
determine the alignment mark deformation offset data further based on the reference wavelength,
wherein the reference wavelength corresponds to an average wavelength.

14. The lithographic apparatus of claim 8, wherein the controller is further configured to:
refit the alignment mark deformation data using an asymmetry extended grid model (AEGM) machine learning model trained on a set of training wafers by a process comprising:
varying respective substrate deformation data for each training wafer in the set of training wafers,
fitting alignment mark deformation data on each training wafer in the set of training wafers, and
refitting the fitted alignment mark deformation data for each alignment mark disposed on each wafer in the set of training wafers to generate modified alignment mark deformation data; and
determine the correction to the measurement data signal based on the substrate deformation data and the modified alignment mark deformation data.

15. A method, comprising:
receiving measurement data indicative of an interference between light diffracted from a plurality of alignment marks disposed on a substrate or reflected from the substrate;
determining substrate deformation data based on the measurement data;
determining alignment mark deformation data based on the measurement data, wherein the alignment mark deformation data comprises alignment mark deformation spectral pattern data, alignment mark deformation amplitude data, and alignment mark deformation offset data; and
determining a correction to the measurement data based on the substrate deformation data and the alignment mark deformation data.

16. The method of claim 15, wherein the received light comprises a plurality of wavelengths.

17. The method of claim 15, wherein the received light comprises a plurality of polarization phases.

18. The method of claim 15, wherein the determining the alignment mark deformation data comprises determining the alignment mark deformation data based on a similarity value of spectral and polarization patterns of the measurement data to a set of reduced-dimensionality basis functions representing different modes of mark asymmetry.

19. The method of claim 18, wherein the alignment mark deformation amplitude data is proportional to an alignment mark asymmetry map comprising a respective amplitude of each reduced-dimensionality basis function in the set of reduced-dimensionality basis functions.

20. The method of claim 15, wherein the method further comprises:
determining a reference wavelength; and
determining the alignment mark deformation offset data further based on the reference wavelength,
wherein the reference wavelength corresponds to an average wavelength.

* * * * *